(12) United States Patent
Takeda et al.

(10) Patent No.: US 7,049,190 B2
(45) Date of Patent: May 23, 2006

(54) METHOD FOR FORMING ZNO FILM, METHOD FOR FORMING ZNO SEMICONDUCTOR LAYER, METHOD FOR FABRICATING SEMICONDUCTOR DEVICE, AND SEMICONDUCTOR DEVICE

(75) Inventors: Katsutoshi Takeda, Katano (JP); Masao Isomura, Hiratsuka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/390,563

(22) Filed: Mar. 17, 2003

(65) Prior Publication Data

US 2004/0038446 A1 Feb. 26, 2004

(30) Foreign Application Priority Data

Mar. 15, 2002 (JP) .............................. 2002-072906
Mar. 26, 2002 (JP) .............................. 2002-084770
Mar. 5, 2003 (JP) .............................. 2003-058611

(51) Int. Cl.
*H01L 21/8238* (2006.01)
(52) U.S. Cl. ...................... 438/216; 438/261; 438/591
(58) Field of Classification Search ................ 438/216, 438/261, 287, 591
See application file for complete search history.

(56) References Cited

U.S. PATENT DOCUMENTS 6,448,585 B1 * 9/2002 Kadota ........................ 257/103
6,617,183 B1 * 9/2003 Kadota et al. ................ 438/22
2002/0025594 A1 2/2002 Iwata et al.

FOREIGN PATENT DOCUMENTS

| JP | 63-290256 A1 | 11/1988 |
| JP | 8-325711 A1 | 12/1996 |
| JP | 2000-244014 | 9/2000 |
| JP | 2001-287998 | 10/2001 |

* cited by examiner

*Primary Examiner*—George Fourson
*Assistant Examiner*—Fernando L. Toledo
(74) *Attorney, Agent, or Firm*—Darby & Darby

(57) ABSTRACT

A ZnO buffer layer having an electric conductivity of $1 \times 10^{-9}$ S/cm or lower or alternatively a ZnO buffer layer having a diffraction peak of a crystal face other than (002) and (004) in X-ray diffraction is formed on a substrate by sputtering. A ZnO semiconductor layer is formed on the ZnO buffer layer. The ZnO semiconductor layer is formed under the condition that the flow rate ratio of an oxygen gas in a sputtering gas is lower than that in the formation of the ZnO buffer layer.

4 Claims, 24 Drawing Sheets

F I G. 1
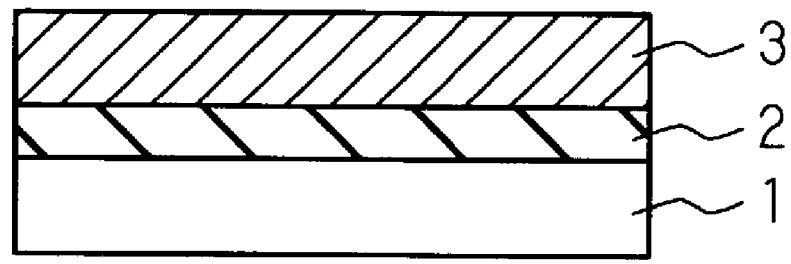

$O_2/(Ar+O_2)=0\%$, THICKNESS 200nm (SURFACE)      (SECTION)

$O_2/(Ar+O_2)=0\%$, THICKNESS 500nm (SURFACE)      (SECTION)

$O_2/(Ar+O_2)=0\%$, THICKNESS 1000nm (SURFACE)      (SECTION)

$O_2/(Ar+O_2)=25\%$, THICKNESS 200nm (SURFACE)        (SECTION)

$O_2/(Ar+O_2)=25\%$, THICKNESS 500nm (SURFACE)        (SECTION)

$O_2/(Ar+O_2)=25\%$, THICKNESS 1000nm (SURFACE)        (SECTION)

$O_2/(Ar+O_2)=100\%$, THICKNESS 200nm (SURFACE)      (SECTION)

$O_2/(Ar+O_2)=100\%$, THICKNESS 500nm (SURFACE)      (SECTION)

$O_2/(Ar+O_2)=100\%$, THICKNESS 1000nm (SURFACE)      (SECTION)

SAMPLE 1

(SURFACE)　　　　　　　(SECTION)

SAMPLE 2

(SURFACE)　　　　　　　(SECTION)

(a)

(b)

(c)

(d)

(a)

(b)

(c)

(d)

METHOD FOR FORMING ZNO FILM, METHOD FOR FORMING ZNO SEMICONDUCTOR LAYER, METHOD FOR FABRICATING SEMICONDUCTOR DEVICE, AND SEMICONDUCTOR DEVICE

BACKGROUND OF THE INVENTION

The present invention relates to: a method for forming a ZnO (zinc oxide) film; a method for forming a ZnO semiconductor layer; a method for fabricating a semiconductor device, such as a light emitting device, a light receiving device, and a thin film transistor (TFT), comprising a ZnO semiconductor layer; and a semiconductor device comprising a ZnO semiconductor layer.

ZnO semiconductors are in direct transitions and have the feature that the bandgap is wide (not less than 3.4 eV). Thus, application of the ZnO semiconductors to semiconductor devices, such as light emitting or receiving devices for emitting or receiving light in blue through ultraviolet ranges and TFTs, is under consideration.

Known methods for forming a ZnO semiconductor layer include MBE, sputtering, and laser ablation. Recently, for the purpose of improving the crystallinity of ZnO semiconductor layers, formation of a ZnO semiconductor layer via a buffer layer is under consideration.

It is disclosed that when a ZnO light emitting layer is formed via a ZnO buffer layer containing impurities such as Al and Mg, the ZnO light emitting layer is formed in good crystallinity (for example, JP-A-2000-244014). It is also disclosed that when a ZnO semiconductor layer is formed via a ZnO buffer layer formed at a temperature lower than that in the formation of the semiconductor layer, the ZnO semiconductor layer is formed in good crystallinity (for example, JP-A-2001-287998).

Nevertheless, in the above-mentioned prior art using a buffer layer containing impurities, a source for the impurities such as Al and Mg needs to be provided separately. This causes the problem of an increase in the fabrication cost. Further, when the buffer layer containing impurities is formed by sputtering, a ZnO film containing impurities is formed also on the wall and the like of the process chamber. Thus, in case that the buffer layer and the ZnO light emitting layer are formed in the same process chamber, during the formation of the ZnO light emitting layer, the impurities such as Al and Mg can be released into the process chamber from the ZnO film having been deposited on the wall and the like, whereby these undesired impurities can be incorporated into the ZnO light emitting layer. Further, the impurities contained in the buffer layer can diffuse into the ZnO light emitting layer, whereby these undesired impurities can be incorporated into the ZnO light emitting layer. As a result of incorporation of these undesired impurities, the light emitting characteristics of the light emitting layer can be degraded. In order to reduce such incorporation of the undesired impurities, a process chamber for buffer layer formation and a process chamber for light emitting layer formation may be provided separately. Nevertheless, this causes the problem of an increase in the apparatus cost and, hence, in the fabrication cost.

On the other hand, in the prior art using a buffer layer formed at a lower temperature, the incorporation of undesired impurities is reduced. Nevertheless, the temperature is different between the buffer layer formation and the semiconductor layer formation. Accordingly, in case that the ZnO buffer layer and the ZnO semiconductor layer are formed in the same process chamber, a time for raising the temperature of the substrate is necessary after the completion of the buffer layer formation and before the beginning of the semiconductor layer formation. This causes the problem of an increase in the necessary process time and, hence, in the fabrication cost. In order to improve the throughput, a process chamber for buffer layer formation and a process chamber for semiconductor layer formation may be provided separately. Nevertheless, this causes similarly the problem of an increase in the apparatus cost and, hence, in the fabrication cost.

Electronic devices, such as a TFT, a light emitting device, a piezoelectric device, are constructed by stacking thin films having different electric conductivities, such as an insulating film, a semiconductor film, and a conductor film. ZnO is used for forming insulating films, semiconductor films, and conductor films. When an electronic device is constructed using ZnO, the electronic device is constructed by stacking a ZnO film and other films composed of substances having electric conductivities different from that of ZnO or alternatively by stacking a plurality of ZnO films having electric conductivities different from each other. When a plurality of such ZnO films having different electric conductivities are formed by sputtering, each ZnO film is formed using one of ZnO targets different from each other in the amount of doped impurities (such as Al and Ga) so that the carrier density may be adjusted in each ZnO film.

Nevertheless, the prior art method for forming thin films having different electric conductivities needs the preparation of a plurality of substances (ZnO and other substances having electric conductivities different from that of ZnO) or alternatively a plurality of ZnO targets different in the impurity concentration. This causes an increase in the material cost or in the number of fabrication processes, and thereby results in the problem of a higher cost of the electronic devices.

BRIEF SUMMARY OF THE INVENTION

The invention has been devised with considering such a situation. An object of the invention is to provide a method for forming a ZnO semiconductor layer having good crystallinity at a low cost.

Another object of the invention is to provide a method for fabricating a semiconductor device comprising a ZnO semiconductor layer having good crystallinity at a low cost.

Further another object of the invention is to provide a semiconductor device comprising a ZnO semiconductor layer having good crystallinity.

Further another object of the invention is to provide a method for easily forming a plurality of ZnO films having different electric conductivities at a reduced material cost.

Further another object of the invention is to provide a method for easily fabricating a semiconductor device comprising a ZnO film having an electric conductivity which varies continuously in the film thickness direction starting from the substrate side.

A method for forming a ZnO semiconductor layer according to a first aspect comprises the steps of forming, on a substrate, a ZnO buffer layer having an electric conductivity of $1 \times 10^{-9}$ S/cm or lower; and forming a ZnO semiconductor layer on the ZnO buffer layer; or alternatively comprises the steps of forming, on a substrate, a ZnO buffer layer having a diffraction peak of a crystal face other than (002) and (004), more specifically, a peak of (103) or (112), in X-ray diffraction; and forming a ZnO semiconductor layer on the ZnO buffer layer.

In the method for forming a ZnO semiconductor layer according to the first aspect, a ZnO buffer layer having an electric conductivity of $1 \times 10^{-9}$ S/cm or lower or alternatively a ZnO buffer layer having a peak other than (002) and (004) is formed on a substrate, and then a ZnO semiconductor layer is formed on the ZnO buffer layer. Accordingly, formed is a ZnO semiconductor layer having good crystallinity and an improved mobility. The reason of this is interpreted as follows.

The ZnO buffer layer having an electric conductivity of $1 \times 10^{-9}$ S/cm or lower or alternatively the ZnO buffer layer having a peak other than (002) and (004) contains large crystal grains. These large crystal grains are distributed somewhat apart from each other. Then, a ZnO semiconductor layer carries out crystal growth starting from these large crystal grains serving as the nuclei of crystal in the ZnO buffer layer. At that time, the large crystal grains are distributed somewhat apart from each other in the ZnO buffer layer. This reduces the mutual blockage of the crystal growth due to the mutual collision of adjacent crystal grains during the crystal growth. As a result, a ZnO semiconductor grows in a large grain size. Further, the ZnO buffer layer is a non-doped layer containing no undesired impurities such as Al and Mg. This avoids the characteristics degradation in the ZnO semiconductor layer due to the incorporation of undesired impurities. Furthermore, the buffer layer is formed from the same material as that of the semiconductor layer. Thus, the junction between the buffer layer and the semiconductor layer constitutes a homojunction which results in good lattice matching. As a result, formed is a ZnO semiconductor layer having good crystallinity and an improved mobility.

A method for forming a ZnO semiconductor layer according to a second aspect is a method for forming a ZnO semiconductor layer on a substrate by sputtering, comprising the steps of forming a ZnO buffer layer on the substrate by using a sputtering gas containing oxygen; and forming a ZnO semiconductor layer on the ZnO buffer layer under the condition that the flow rate ratio of the oxygen gas in the sputtering gas is lower than that in the formation of the ZnO buffer layer.

In the method for forming a ZnO semiconductor layer according to the second aspect, a ZnO buffer layer is formed on the substrate under the condition that the flow rate ratio of the oxygen gas in the sputtering gas is higher. Accordingly, large crystal grains are formed in the ZnO buffer layer. These large crystal grains are distributed not close to but somewhat apart from each other. Further, a ZnO semiconductor layer is formed under the condition that the flow rate ratio of the oxygen gas is lower than that in the formation of the ZnO buffer layer. Accordingly, the formed ZnO semiconductor has a higher electric conductivity than the ZnO buffer layer, and thereby serves as a semiconductor. At that time, the ZnO semiconductor layer carries out crystal growth starting from the large crystal grains serving as the nuclei of crystal in the ZnO buffer layer, while the large crystal grains are distributed somewhat apart from each other in the ZnO buffer layer. This reduces the mutual blockage of the crystal growth due to the mutual collision of adjacent crystal grains during the crystal growth. As a result, a ZnO semiconductor grows in a large grain size. Further, the ZnO buffer layer is a non-doped layer containing no undesired impurities such as Al and Mg. This avoids the characteristics degradation in the ZnO semiconductor layer due to the incorporation of undesired impurities. Furthermore, the buffer layer is formed from the same material as that of the semiconductor layer. Thus, the junction between the buffer layer and the semiconductor layer constitutes a homojunction which results in good lattice matching. As a result, formed is a ZnO semiconductor layer having good crystallinity and an improved mobility.

Preferably in the second aspect, the ZnO buffer layer is formed with the flow rate ratio of the oxygen gas in the sputtering gas being adjusted such that the electric conductivity becomes $1 \times 10^{-9}$ S/cm or lower or alternatively that a diffraction peak of a crystal face other than (002) and (004), more specifically a peak of (103) or (112), appears in X-ray diffraction. In this case, the formed ZnO buffer layer contains larger crystal grains, while adjacent crystal grains are distributed sufficiently apart from each other. This improves efficiently the crystallinity and the mobility of the ZnO semiconductor layer. In this case, the ZnO buffer layer is formed preferably with the flow rate ratio of the oxygen gas of 20% or higher. The flow rate ratio of the oxygen gas of 20% or higher permits the formation of a ZnO buffer layer having an electric conductivity of $1 \times 10^{-9}$ S/cm or lower or alternatively a ZnO buffer layer having a peak other than (002) and (004). Thus, formed is a ZnO semiconductor layer having good crystallinity and a high mobility. Further, the film thickness of the ZnO buffer layer is preferably 500 nm or more. The film thickness of 500 nm or more permits the layer to function as a sufficient buffer layer. Thus, formed is a ZnO semiconductor layer having good crystallinity and a high mobility. Further, it is preferable that the ZnO buffer layer and the ZnO semiconductor layer are formed successively. This configuration reduces the formation time and, hence, the fabrication cost. In this case, the successive formation is carried out preferably with the flow rate ratio of the oxygen gas in the sputtering gas being decreased gradually. This configuration also reduces the formation time and, hence, the fabrication cost. Further, the ZnO buffer layer and the ZnO semiconductor layer are formed preferably in a same process chamber. This configuration reduces the number of process chambers, and hence reduces the apparatus cost and the fabrication cost.

A method for fabricating a semiconductor device according to a third aspect comprises the steps of forming, on a substrate, a ZnO buffer layer having an electric conductivity of $1 \times 10^{-9}$ S/cm or lower; and forming a ZnO semiconductor layer on the ZnO buffer layer; or alternatively comprises the steps of forming, on a substrate, a ZnO buffer layer having a diffraction peak of a crystal face other than (002) and (004), more specifically a peak of (103) or (112), in X-ray diffraction; and forming a ZnO semiconductor layer on the ZnO buffer layer.

In the method for fabricating a semiconductor device according to the third aspect, a ZnO buffer layer having an electric conductivity of $1 \times 10^{-9}$ S/cm or lower or alternatively a ZnO buffer layer having a peak other than (002) and (004) is formed on a substrate, and then a ZnO semiconductor layer is formed on the ZnO buffer layer. Accordingly, as described above in the first aspect, formed is a ZnO semiconductor layer having good crystallinity and an improved mobility. This permits the fabrication of a semiconductor device comprising a ZnO semiconductor layer having such good characteristics.

A method for fabricating a semiconductor device according to a fourth aspect is a method for fabricating a semiconductor device having a ZnO semiconductor layer formed by sputtering, comprising the steps of forming a ZnO buffer layer on a substrate by using a sputtering gas containing oxygen; and forming a ZnO semiconductor layer on the ZnO buffer layer under the condition that the flow rate ratio of the oxygen gas in the sputtering gas is lower than that in the formation of the ZnO buffer layer.

In the method for fabricating a semiconductor device according to the fourth aspect, as described above in the second aspect, formed is a ZnO semiconductor layer having good crystallinity and an improved mobility. This permits inexpensive fabrication of a semiconductor device comprising a ZnO semiconductor layer having such good characteristics.

Preferably, in the fourth aspect, the ZnO buffer layer is formed with the flow rate ratio of the oxygen gas being adjusted such that the electric conductivity becomes $1 \times 10^{-9}$ S/cm or lower or alternatively that a diffraction peak of a crystal face other than (002) and (004), more specifically a peak of (103) or (112), appears in X-ray diffraction. In this case, the formed ZnO buffer layer contains larger crystal grains, while adjacent crystal grains are distributed sufficiently apart from each other. This permits efficient fabrication of a semiconductor device comprising a ZnO semiconductor layer having much improved crystallinity and mobility. In this case, the ZnO buffer layer is formed preferably with the flow rate ratio of the oxygen gas in the sputtering gas of 20% or higher. The flow rate ratio of the oxygen gas of 20% or higher permits the formation of a ZnO buffer layer having an electric conductivity of $1 \times 10^{-9}$ S/cm or lower or alternatively a ZnO buffer layer having a peak other than (002) and (004). Thus, fabricated is a semiconductor device comprising a ZnO semiconductor layer having good crystallinity and a high mobility. Further, the film thickness of the ZnO buffer layer is preferably 500 nm or more. The film thickness of 500 nm or more permits the layer to function as a sufficient buffer layer. Thus, fabricated is a semiconductor device comprising a ZnO semiconductor layer having good crystallinity and a high mobility.

A semiconductor device according to a fifth aspect comprises: a substrate; a ZnO layer formed on the substrate and having an electric conductivity of $1 \times 10^{-9}$ S/cm or lower; and a ZnO semiconductor layer formed on the ZnO layer; or alternatively comprises: a substrate; a ZnO layer formed on the substrate and having a diffraction peak of a crystal face other than (002) and (004), more specifically a peak of (103) or (112), in X-ray diffraction; and a ZnO semiconductor layer formed on the ZnO layer.

The semiconductor device according to the fifth aspect comprises a ZnO semiconductor layer formed on a ZnO buffer layer having an electric conductivity of $1 \times 10^{-9}$ S/cm or lower or alternatively on a ZnO buffer layer having a peak other than (002) and (004). Accordingly, as described above in the first aspect, the ZnO semiconductor layer has good crystallinity and an improved mobility. This provides a semiconductor device having good characteristics.

A method for forming a ZnO film according to a sixth aspect is a method for forming a ZnO film by sputtering, wherein: non-doped ZnO is used as a target; an inert gas, an oxygen gas, or a mixture gas between an inert gas and an oxygen gas is used as a sputtering gas; and the flow rate ratio of the oxygen gas in the sputtering gas is changed during the film formation.

In the method for forming a ZnO film according to the sixth aspect, the electric conductivity of the formed ZnO film varies depending on the flow rate ratio of the oxygen gas in the sputtering gas during the ZnO film formation. This permits the adjustment of the electric conductivity of the ZnO film by using non-doped ZnO as the only target material and by changing the flow rate ratio of the oxygen gas. The sole use of ZnO reduces the material cost, and further avoids the necessity of changing the target. This reduces the number of fabrication processes. Further, since the electric conductivity is adjusted by changing the flow rate ratio of the oxygen gas, a plurality of ZnO films having different electric conductivities can be formed easily. This avoids a cost increase in electronic devices comprising ZnO films, and further increases the degree of freedom in the design of electronic devices. It should be noted that when the flow rate ratio of the oxygen gas in the sputtering gas is set at 100%, the sputtering gas is composed solely of an oxygen gas, and that when the flow rate ratio of the oxygen gas is set at 0%, the sputtering gas is composed solely of an inert gas.

In the sixth aspect, the flow rate ratio of the oxygen gas is changed continuously. In case that the flow rate ratio of the oxygen gas in the sputtering gas is continuously increased during the formation of a ZnO film, the electric conductivity of the formed ZnO film decreases continuously. In case that the flow rate ratio of the oxygen gas is continuously decreased, the electric conductivity of the formed ZnO film increases continuously. This permits easy formation of a ZnO film having an electric conductivity which varies continuously in the film thickness direction. This permits easy and low-cost formation of a stacked film having an LDD (lightly doped drain)/semiconductor film (active layer) structure.

In the sixth aspect, the flow rate ratio of the oxygen gas is increased and decreased alternately. For example, a first ZnO film is formed at a high flow rate ratio of the oxygen gas in the sputtering gas, and then a second ZnO film is formed on the first ZnO film at a low flow rate ratio of the oxygen gas. In this case, the first ZnO film has a lower electric conductivity than the second ZnO film. As such, ZnO films having a high electric conductivity and ZnO films having a low electric conductivity can easily be stacked alternately. This permits easy and low-cost formation of a stacked structure composed of a plurality of ZnO films having different electric conductivities.

A method for fabricating a semiconductor device according to a seventh aspect is a method for fabricating a semiconductor device wherein ZnO films are stacked on a substrate by sputtering whereby a source electrode, a drain electrode, and a gate electrode are provided, the method comprising the steps of using non-doped ZnO as a target, and using an inert gas, an oxygen gas, or a mixture gas between an inert gas and an oxygen gas as a sputtering gas, and thereby starting the formation of a first ZnO film by sputtering with a sputtering gas composed of the oxygen gas or the mixture gas; forming a second ZnO film by sputtering with the flow rate ratio of the oxygen gas in the sputtering gas being decreased continuously; forming a groove for dividing the second ZnO film; providing a gate electrode over the groove via an insulating layer; and providing, on the second ZnO film, a source electrode and a drain electrode so as to face to each other with the groove between.

In the method for fabricating a semiconductor device according to the seventh aspect, after the formation of the first ZnO film, the second ZnO film is formed with the flow rate ratio of the oxygen gas being decreased continuously. Accordingly, the electric conductivity of the second ZnO film increases continuously in the film thickness direction starting from the substrate side. As a result, the high-electric conductivity regions on the source electrode side and the drain electrode side of the second ZnO film serve as a source region and a drain region. Further, the lower-electric conductivity region on the first ZnO film side of the second ZnO film serves as an LDD region.

The above and further objects and features of the invention will more fully be apparent from the following detailed description with accompanying drawings.

BRIEF DESCRIPTION OF THE SEVERAL VIEWS OF THE DRAWINGS

FIG. 1 is a cross sectional view of a structure illustrating a method for forming a ZnO semiconductor layer according to the invention;

DETAILED DESCRIPTION OF THE INVENTION

The invention is described below in detail with reference to the drawings showing the embodiments.

(Embodiment 1)

FIG. 1 is a cross sectional view of a structure illustrating a method for forming a ZnO semiconductor layer according to Embodiment 1 of the invention. Referring to the figure, numeral 1 indicates a substrate. The substrate may be composed of a glass substrate, a sapphire substrate, a quartz substrate, a silicon substrate, a fused quartz substrate, or the like, and not limited to these. Numeral 2 indicates a ZnO buffer layer. Numeral 3 indicates a ZnO semiconductor layer. In the present embodiment, the ZnO buffer layer 2 is formed by sputtering at a high flow rate ratio of the oxygen gas, while the ZnO semiconductor layer 3 is formed by sputtering at a low flow rate ratio of the oxygen gas.

The influence of the flow rate ratio of the oxygen gas in the sputtering gas to the crystallinity of the ZnO film is described below in detail.

Figure 2:
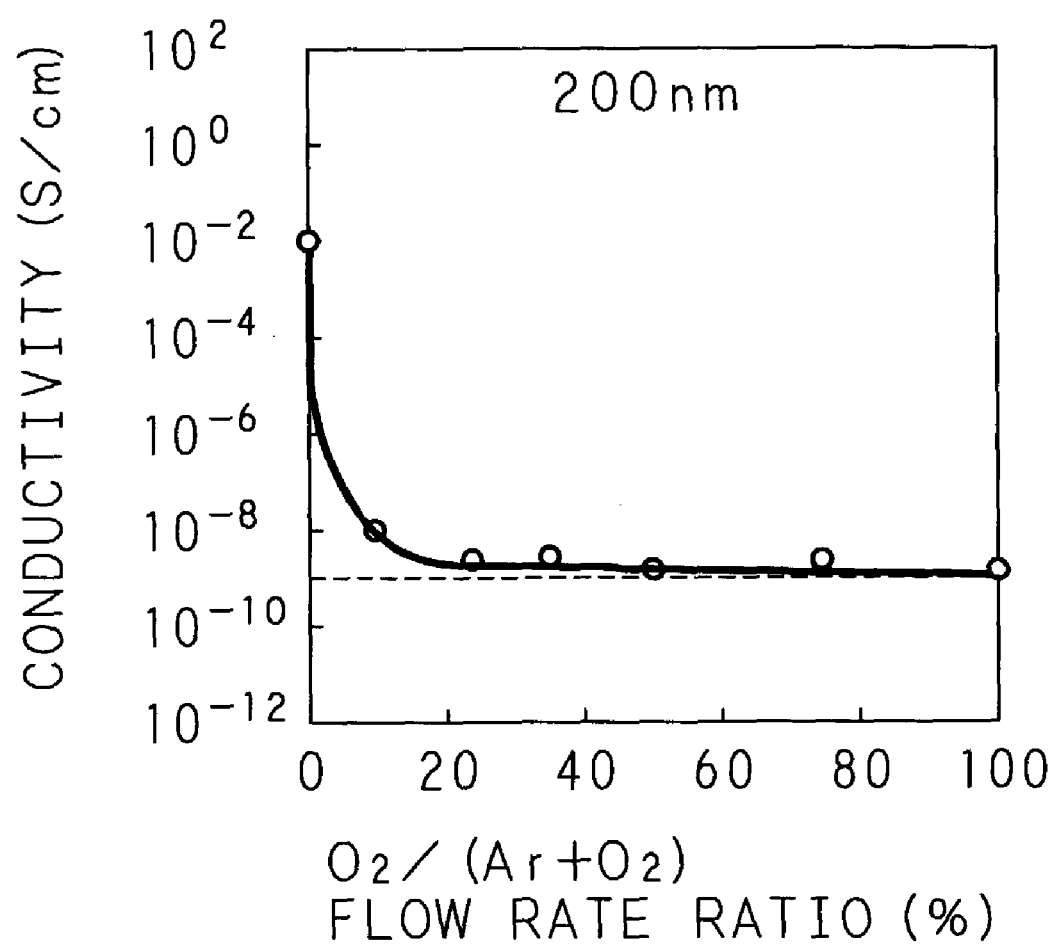
FIG. 2 is a characteristics diagram showing the relation between the electric conductivity of a ZnO film (film thickness: 200 nm) and the flow rate ratio of the oxygen gas.
Figure 3:
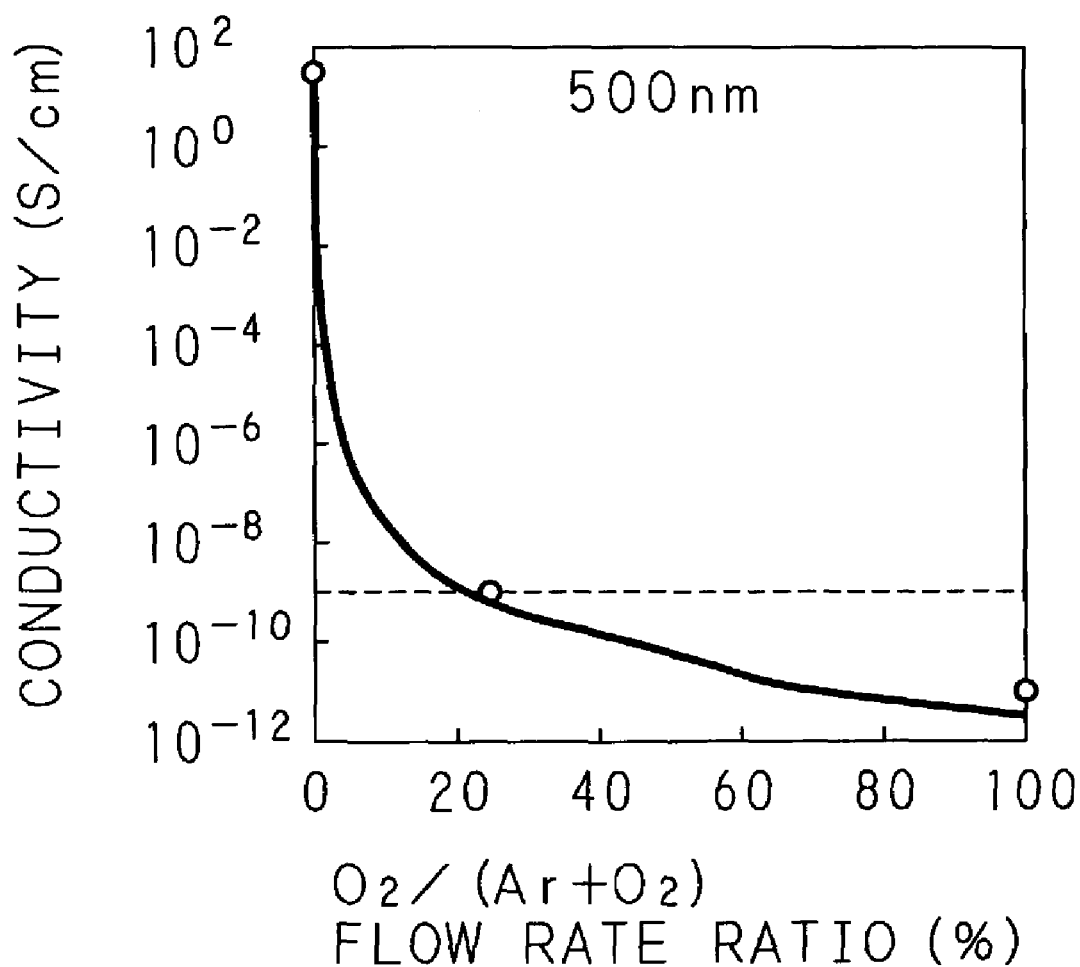
FIG. 3 is a characteristics diagram showing the relation between the electric conductivity of a ZnO film (film thickness: 500 nm) and the flow rate ratio of the oxygen gas.
Figure 4:
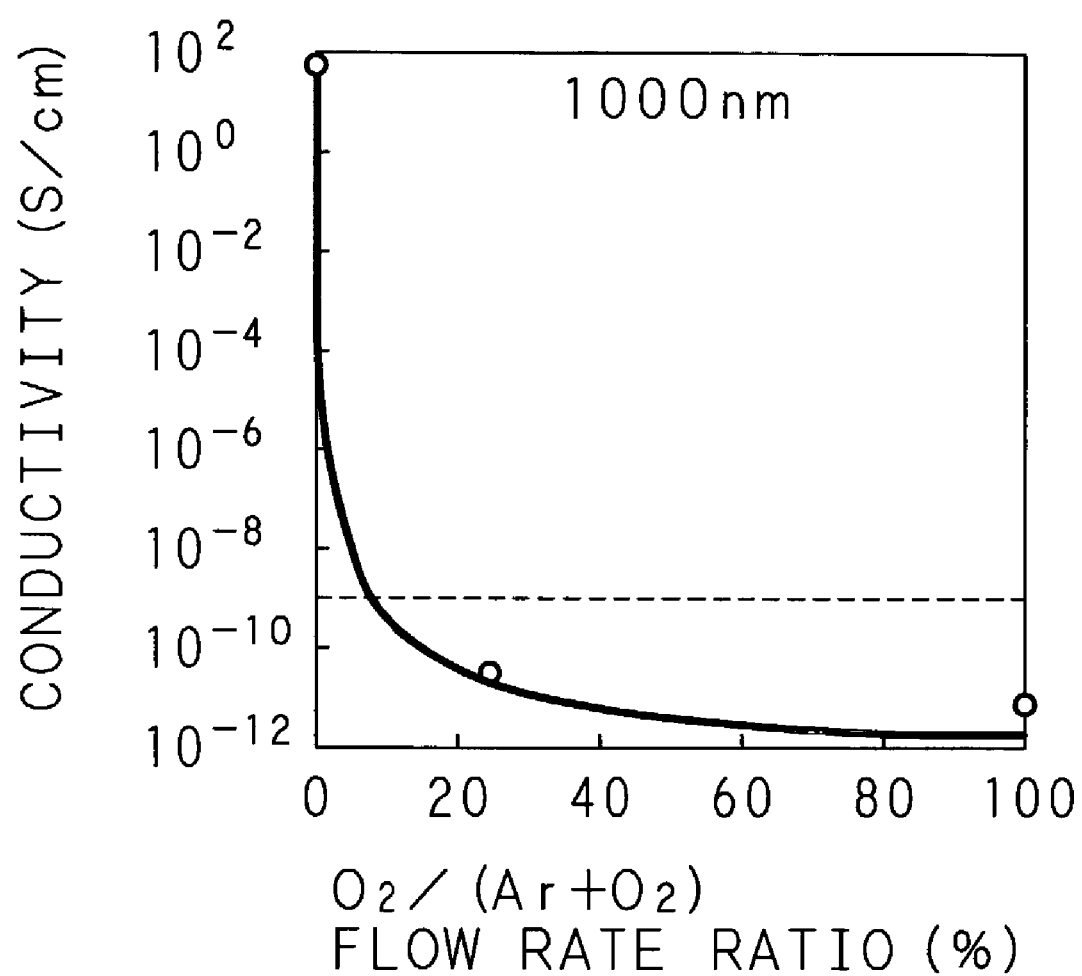
FIG. 4 is a characteristics diagram showing the relation between the electric conductivity of a ZnO film (film thickness: 1000 nm) and the flow rate ratio of the oxygen gas.

FIGS. 2, 3, and 4 are characteristics diagrams showing the relation between the electric conductivity of a ZnO film having a thickness of 200 nm, 500 nm, and 1000 nm and the flow rate ratio of the oxygen gas in case that the ZnO film has been formed on a glass substrate at a diverse flow rate ratio of the oxygen gas in the sputtering gas. The condition of formation is shown in Table 1. The sputtering gas used was a mixture gas between Ar gas and $O_2$ gas. The formation of the ZnO film was carried out using an RF magnetron sputtering apparatus.

TABLE 1

| Target | Non-Doped ZnO |
|---|---|
| Substrate Temperature | 300° C. |
| RF Power | 100 W |
| Pressure | 0.6 Pa |
| Sputtering Gas | Ar:0~15 sccm<br>$O_2$:0~15 sccm |

[ Ar flow rate and $O_2$ flow rate are controlled so that total flow rate is 15 sccm ]

As shown in FIGS. 2–4, the electric conductivity of the formed ZnO film depends strongly on the flow rate ratio of the oxygen gas in the sputtering gas. That is, with increasing flow rate ratio of the oxygen gas, the electric conductivity decreases, and hence the ZnO film has a higher resistance. The reason of this is thought that when the amount of oxygen increases in the ZnO film, donors due to oxygen defects are reduced whereby the electric conductivity decreases. Further, the ZnO film having a thickness of 200 nm does not fall below the electric conductivity of $1 \times 10^{-9}$ S/cm even when the flow rate ratio of the oxygen gas is increased as high as possible (FIG. 2). However, an electric conductivity of $1 \times 10^{-9}$ S/cm or lower is reached when the flow rate ratio of the oxygen gas is 20% or higher for the ZnO film having a thickness of 500 nm (FIG. 3) or alternatively when the flow rate ratio of the oxygen gas is 10% or higher for the ZnO film having a thickness of 1000 nm (FIG. 4). The ZnO semiconductor layer according to the invention indicates that having n-type or p-type electric conductivity. The value of this electric conductivity is, for example, $1\times10^{-9}$ S/cm or higher. Such a ZnO semiconductor layer is formed at a very low flow rate ratio of the oxygen gas in the sputtering gas. The result of a Hall effect measurement has shown that the film formed at a low flow rate ratio of the oxygen gas and thereby having a high electric conductivity has n-type electric conductivity.

Figure 5:
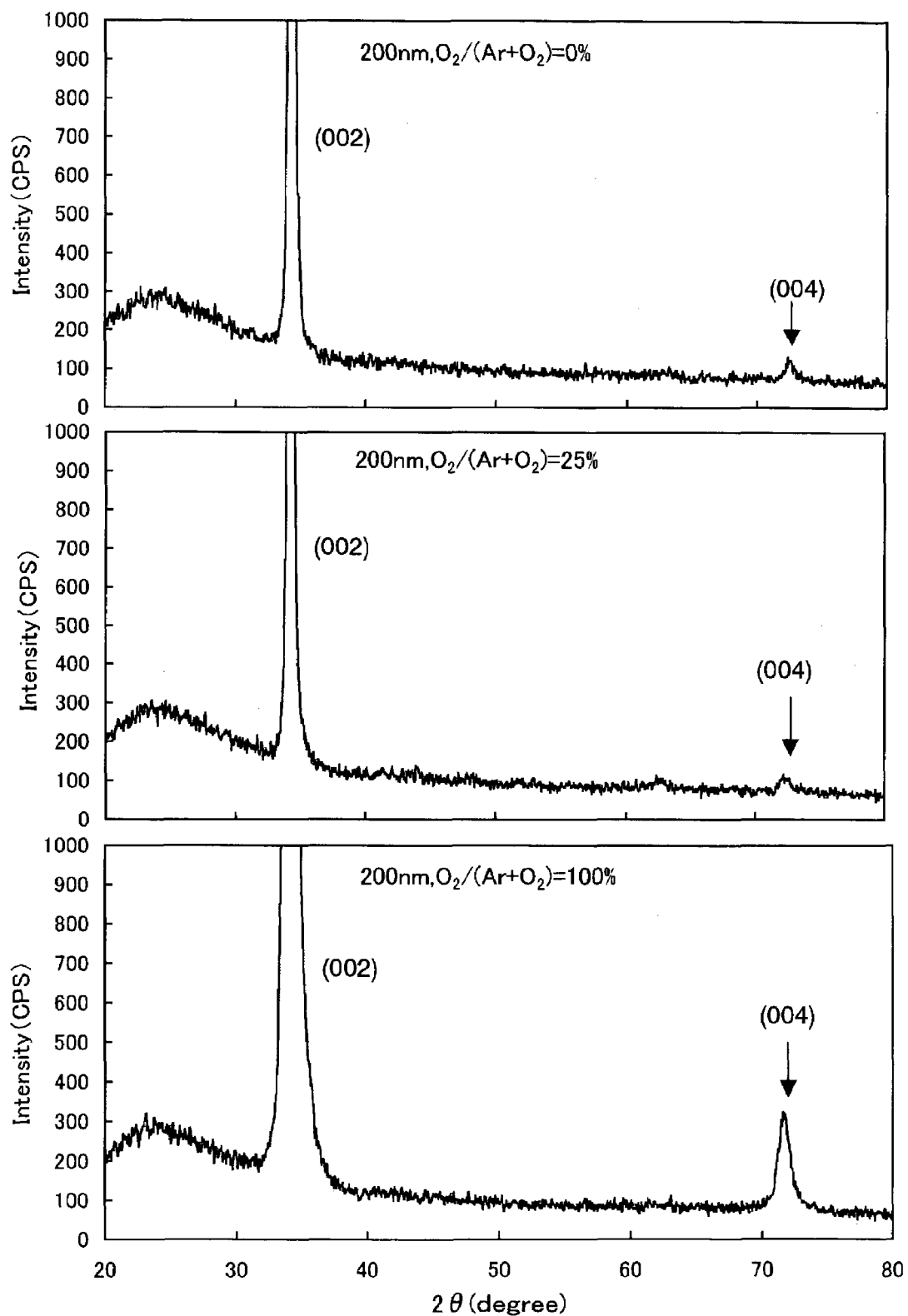
FIG. 5 shows characteristics diagrams showing the characterization result of a ZnO film (film thickness: 200 nm) by X-ray diffraction.
Figure 6:
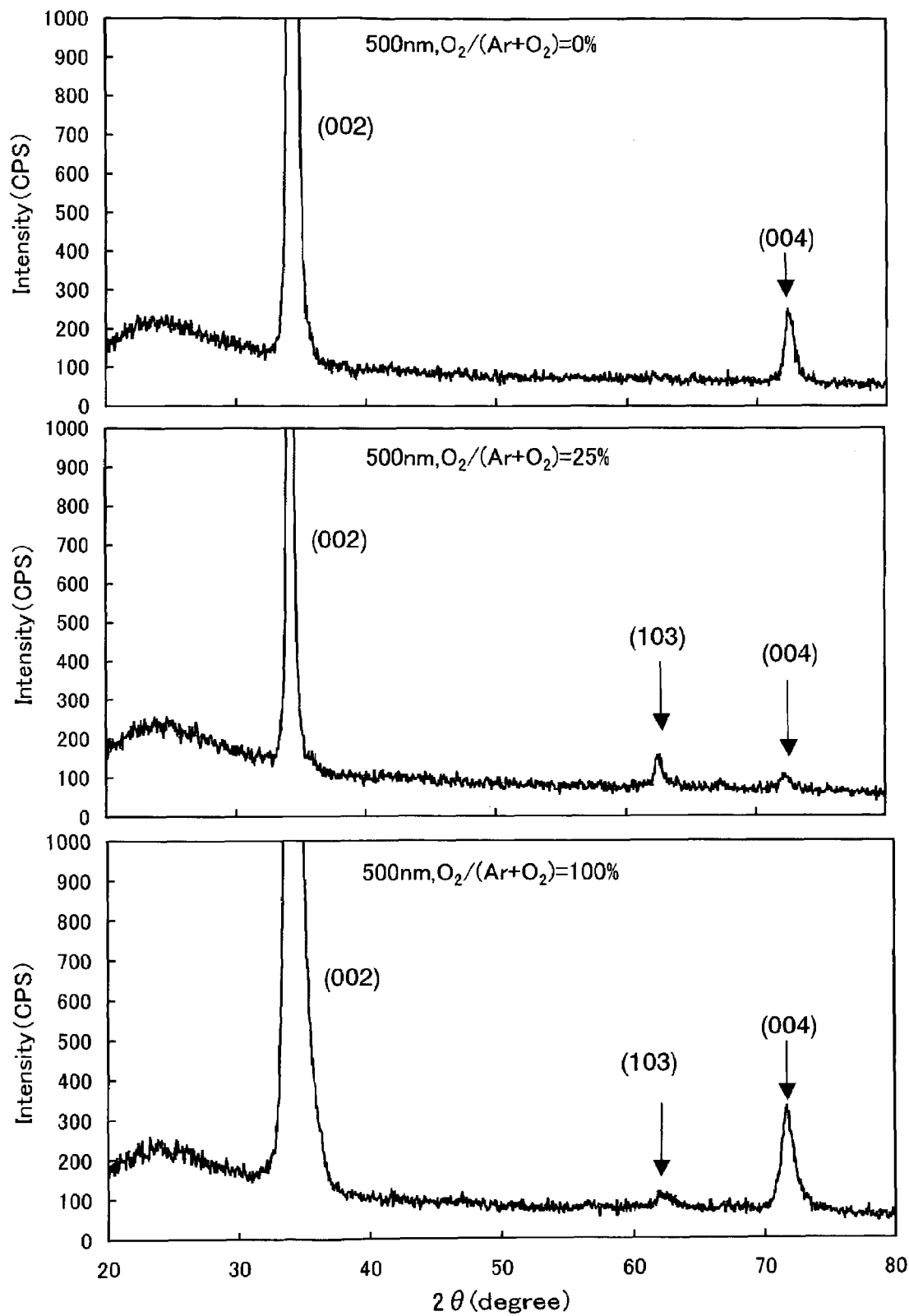
FIG. 6 shows characteristics diagrams showing the characterization result of a ZnO film (film thickness: 500 nm) by X-ray diffraction.
Figure 7:
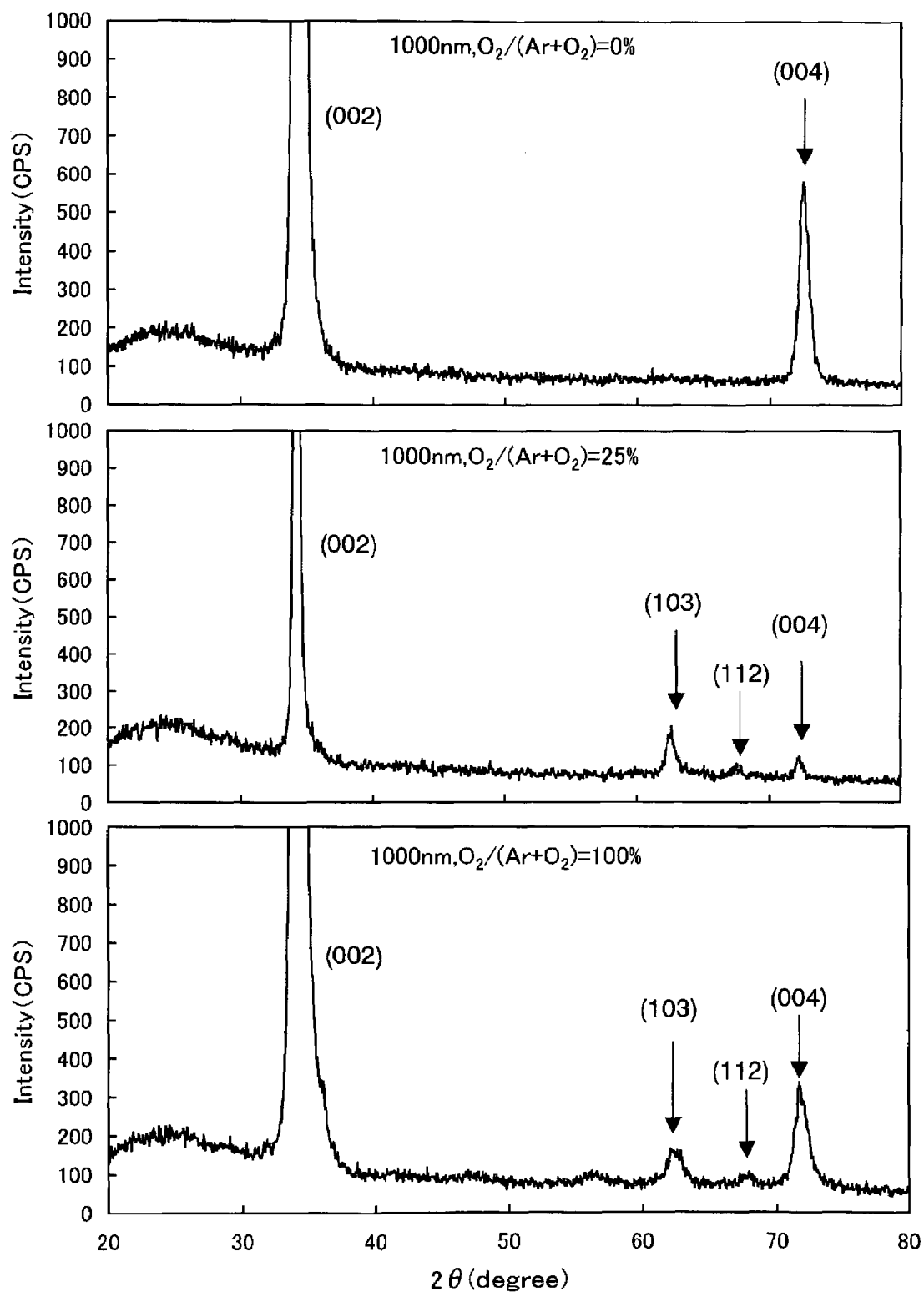
FIG. 7 shows characteristics diagrams showing the characterization result of a ZnO film (film thickness: 1000 nm) by X-ray diffraction.
Figure 8A:
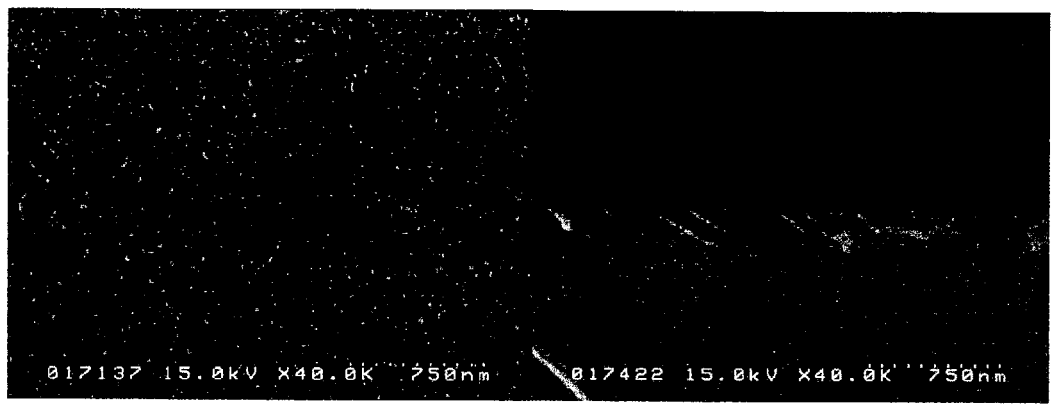
FIGS. 8A–8C shows SEM image photographs of a ZnO film (flow rate ratio of the oxygen gas: 0%)
Figure 8B:
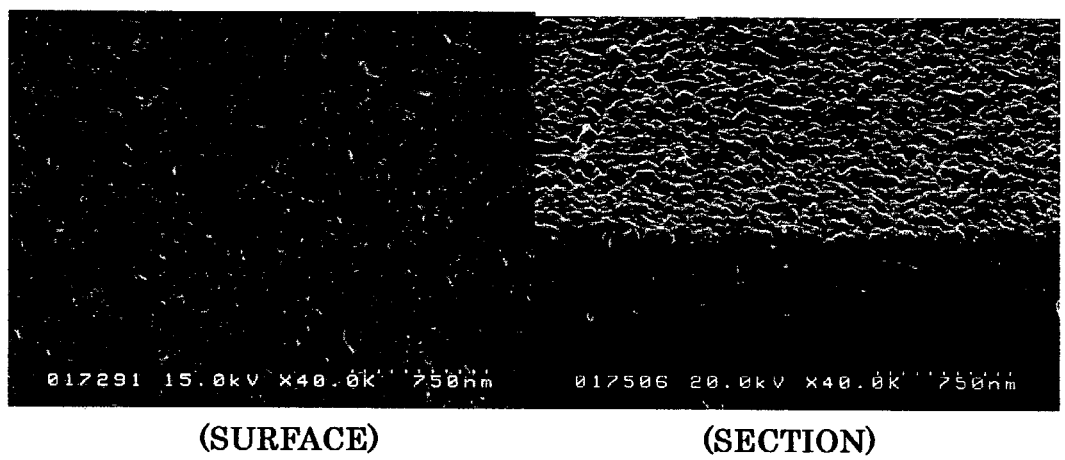
Figure 8C:
Figure 9A:
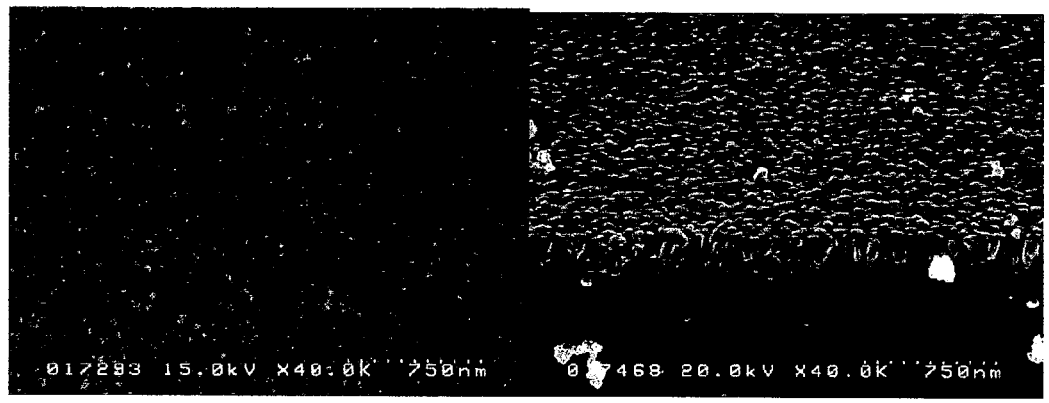
FIGS. 9A–9C shows SEM image photographs of a ZnO film (flow rate ratio of the oxygen gas: 25%)
Figure 9B:
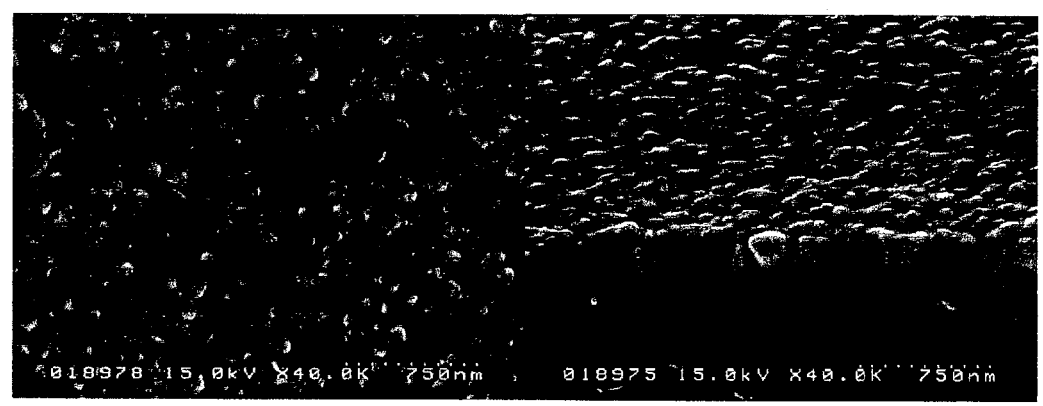
Figure 9C:
Figure 10A:
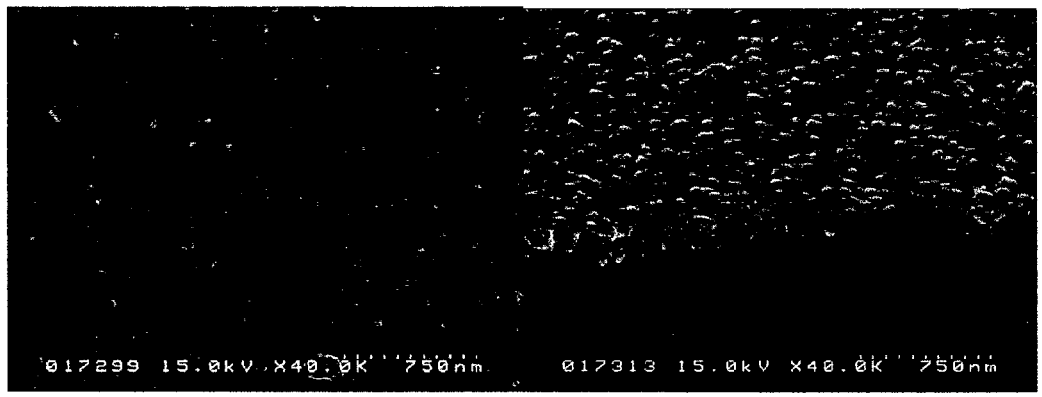
FIGS. 10A–10C shows SEM image photographs of a ZnO film (flow rate ratio of the oxygen gas: 100%)
Figure 10B:
Figure 10C:
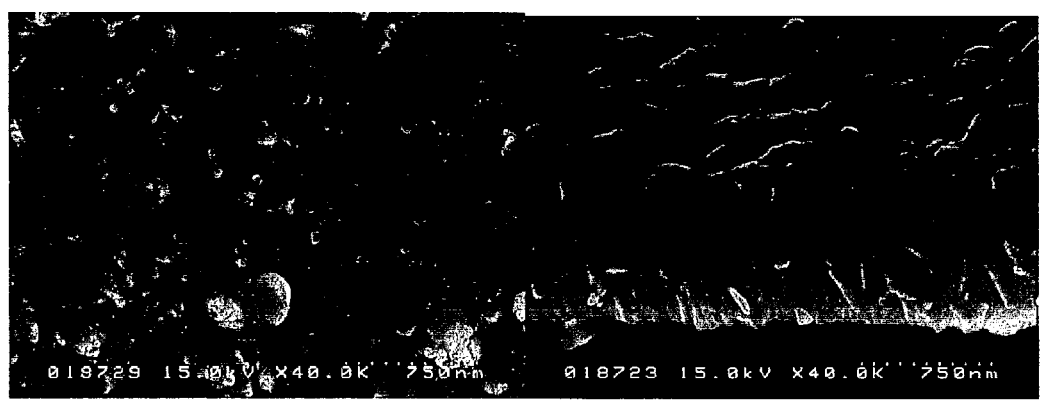

FIGS. 5, 6, and 7 are characteristics diagrams showing the result of the X-ray diffraction (XRD) characterization of the crystallinity of the above-mentioned ZnO films having a thickness of 200 nm, 500 nm, and 1000 nm in case that the formation was carried out at the flow rate ratio of the oxygen gas of 0%, 25%, and 100%. Each diagram shows a measured XRD spectrum.

At a high flow rate ratio of the oxygen gas (25% and 100%), the ZnO films having a thickness of 500 nm and 1000 nm have a diffraction peak of (103) or (112) of a ZnO crystal face other than (002) and (004) in the XRD characterization.

Figure 11:
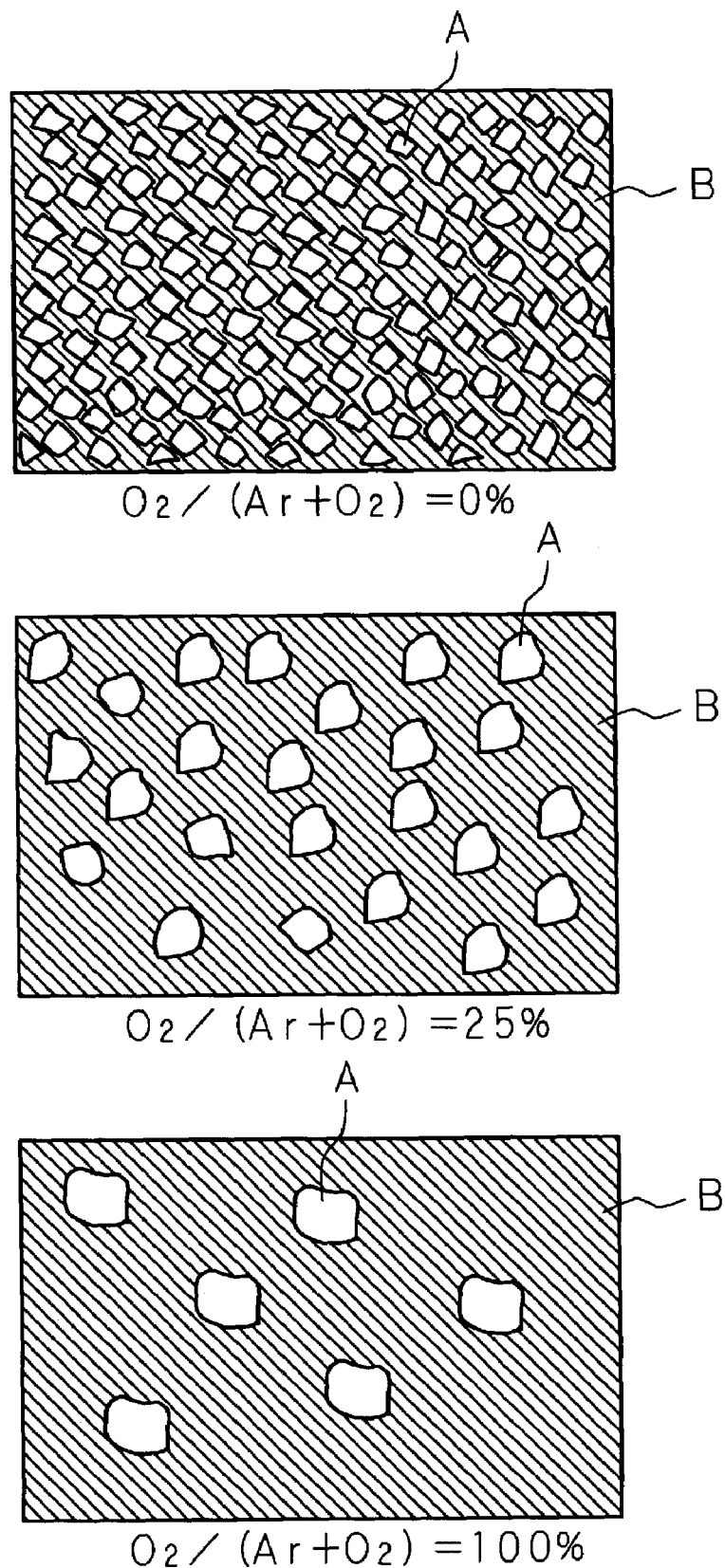
FIG. 11 shows schematic views of surface SEM photographs of a ZnO film.

FIGS. 8A–8C, 9A–9C, and 10A–10C are photographs showing SEM images (secondary electron images) of the surface and the cross section of each of the above-mentioned ZnO films. FIG. 11 shows schematic views of the obtained SEM photographs of the ZnO films formed at the flow rate ratio of the oxygen gas of 0%, 25%, and 100%. In FIG. 11, region A indicates a crystal region composed of a large crystal grain of a size of 40 nm or larger. Region B indicates a aggregated region composed of small crystal grains (of a size less than 20 nm). A low flow rate ratio of the oxygen gas produces many small crystal grains distributed close to each other, while a high rate ratio of the oxygen gas produces large crystal grains separated somewhat apart from each other.

Figure 12:
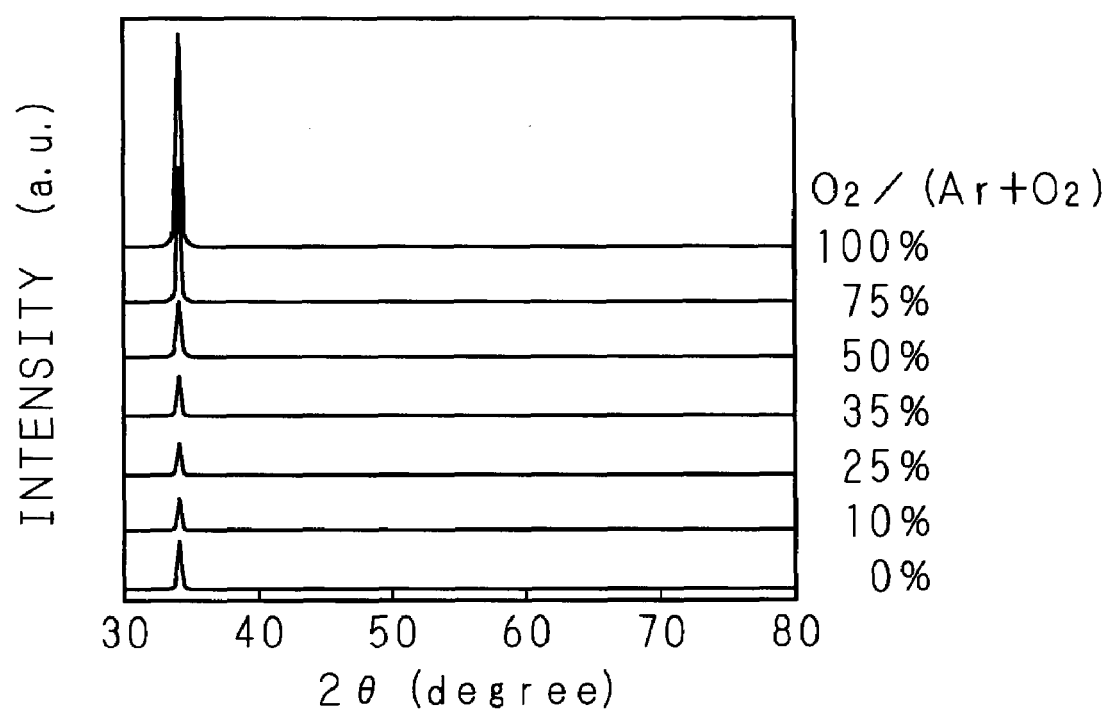
FIG. 12 is a characteristics diagram showing the characterization result of the crystallinity of a ZnO film by X-ray diffraction.

FIG. 12 is a characteristics diagram showing the result of the XRD characterization of the crystallinity of the ZnO film having a thickness of 200 nm shown in FIG. 2. Each curve shows a measured XRD spectrum. In the figure, the value associated with each spectrum indicates the flow rate ratio of the oxygen gas in the sputtering gas during the film formation. As seen from FIG. 12, a peak caused by the (002) face is observed in every ZnO film. Further, the peak height increases with increasing flow rate ratio of the oxygen gas. In particular, at flow rate ratios of the oxygen gas of 50% or higher, the peak height increases notably. This indicates notable improvement in the crystallinity.

Table 2 shows the summary of the result of the characterization of the crystallinity and the grain size of the ZnO films formed at various flow rate ratios of the oxygen gas shown in FIG. 12. In the characterization of the crystallinity, the peak height for the (002) face of the ZnO film obtained at the flow rate ratio of the oxygen gas of 100% is normalized to 100, whereby the peak height for the (002) face of each sample is shown by a relative value. The grain size was obtained from the SEM photographs.

TABLE 2

| Flow Rate Ratio of Oxygen Gas (%) | 0 | 10 | 25 | 35 | 50 | 75 | 100 |
|---|---|---|---|---|---|---|---|
| Peak Height for (002) Face (%) | 20 | 17 | 18 | 19 | 31 | 69 | 100 |
| Grain size (nm) | 40 | 40 | 67 | 67 | 70 | 75 | 80 |

As described above, when a ZnO film is formed by sputtering, the grain size increases with increasing flow rate ratio of the oxygen gas in the sputtering gas. Further, at high flow rate ratios of the oxygen gas, obtained is a film having a peak of (103) or (112) other than (002) and (004) in the X-ray diffraction pattern. Furthermore, at high flow rate ratios of the oxygen gas, obtained is a film having a higher peak of the (002) face.

In the application to a buffer layer, preferable is a film which has a large grain size and in which the crystal grains are distributed apart from each other. Thus, when a buffer layer comprising crystal grains is used, a semiconductor layer carries out crystal growth starting from the crystal grains serving as the nuclei of crystal in the buffer layer. At that time, when a buffer layer the crystal grains of which are distributed somewhat apart from each other is used, reduced is the mutual blockage of the crystal growth due to the mutual collision of adjacent crystal grains during the crystal growth. As a result, a semiconductor layer grows in a large grain size. In contrast, when many crystal grains are distributed close each other in the buffer layer, the mutual collision of adjacent crystal grains during the crystal growth causes the mutual blockage of the crystal growth. Thus, crystals having a large grain size are difficult to grow. Further, a larger size of the crystal grains serving as the nuclei of crystal results in a larger grain size of the crystals having grown from the nuclei.

Furthermore, the buffer layer is formed from the same ZnO material as that of the semiconductor layer. This avoids the problem of diffusion, or the like, of undesired impurities from the buffer layer. This permits the formation of a ZnO semiconductor layer having good characteristics.

Accordingly, when a ZnO film which has been formed at a high flow rate ratio of the oxygen gas in the sputtering gas and in which large crystal grains are distributed somewhat apart from each other is used as a buffer layer, and when a ZnO semiconductor layer is formed on this film, a ZnO semiconductor layer having a large grain size and hence good crystallinity is expectedly obtained.

More specifically, such a ZnO buffer layer in which large crystal grains are distributed somewhat apart from each other is expected to be preferably composed of a ZnO film having an electric conductivity of $1\times10^{-9}$ S/cm or lower or alternatively a ZnO film having a diffraction peak (for example, of (103) or (112)) of a crystal face other than (002) and (004) in X-ray diffraction.

The ZnO film having an electric conductivity of $1\times10^{-9}$ S/cm or lower has high crystallinity as shown in FIG. 12. Further, in the film, large crystal grains are distributed somewhat apart from each other as shown in FIG. 11. Further, as seen from the results of FIGS. 5–10, in the ZnO film having a peak (for example, of (103) or (112)) other than (002) and (004), a larger residual stress is present in the film, while large crystal grains are distributed somewhat apart from each other, in comparison with the case of a ZnO film having the peaks of (002) and (004) solely.

Accordingly, such a ZnO film having an electric conductivity of $1\times10^{-9}$ S/cm or lower or alternatively a ZnO film having a peak other than (002) and (004) is preferable as a buffer layer. The ZnO film having an electric conductivity of $1\times10^{-9}$ S/cm or lower is formed, for example, by sputtering at a flow rate ratio of the oxygen gas of 20% or higher. The lower limit of the electric conductivity of the ZnO buffer layer formable by adjusting the flow rate ratio of the oxygen gas is approximately $1\times10^{-12}$ S/cm which is obtained at the flow rate ratio of the oxygen gas of 100%. Further, the ZnO film having a peak of (103) or (112) other than (002) and (004) is formed, for example, by sputtering at a flow rate ratio of the oxygen gas of 25% or higher. However, the formation of the ZnO buffer layer having the above-mentioned configuration is not limited to this, and can be carried out by controlling other conditions, such as the input power and the pressure, or a combination of these conditions.

EXAMPLE 1

In Example 1, a ZnO buffer layer 2 and a ZnO semiconductor layer 3 were formed on a glass substrate 1 by sputtering under the condition shown in Table 3.

TABLE 3

|  | Substrate Temperature (° C.) | RF Power (W) | Pressure (Pa) | Ar Flow Rate (sccm) | $O_2$ Flow Rate (sccm) | Thickness (nm) |
|---|---|---|---|---|---|---|
| Buffer Layer | 300 | 100 | 0.6 | 0~15 | 0~15 | 500 or 800 |
| Semiconductor Layer | 300 | 100 | 0.6 | 15 | 0 | 200 |

*In formation of buffer layer, Ar flow rate + $O_2$ flow rate = 15 sccm

The ZnO buffer layer 2 and the ZnO semiconductor layer 3 were formed successively in the same sputtering chamber by maintaining the substrate temperature at constant at 300° C. and by changing the sputtering gas without stopping the electric discharge. In the formation of the ZnO buffer layer 2, plural kinds of ZnO buffer layers 2 were formed using a mixture gas between Ar gas and $O_2$ gas as the sputtering gas, at a constant total flow rate of the sputtering gas of 15 sccm, at various flow rate ratios of the oxygen gas of 25%, 50%, and 100%, into various film thickness values of 500 nm and 800 nm. Then, a ZnO semiconductor layer 3 was formed on each of the plural kinds of ZnO buffer layers 2 under the same condition (flow rate ratio of the oxygen gas of 0% and film thickness of 200 nm).

As an example for comparison, fabricated is a sample in which a ZnO buffer layer 2 is not formed and in which a ZnO semiconductor layer 3 is formed directly on a substrate 1 under the same condition as that of Table 3.

Figure 13:
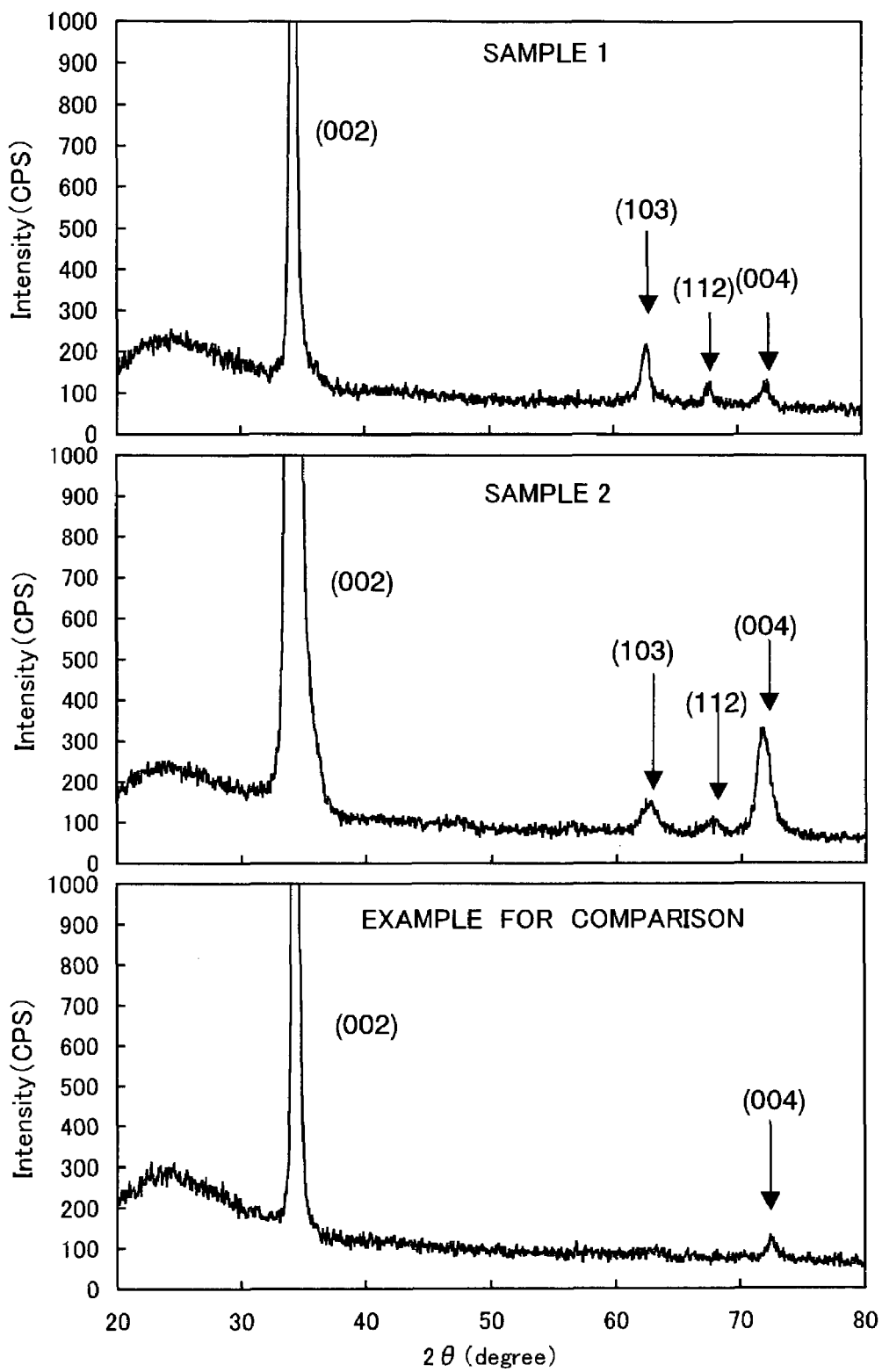
FIG. 13 shows characteristics diagrams showing the characterization result of a stacked film composed of glass/ZnO buffer layer/ZnO semiconductor layer by X-ray diffraction.
Figure 14A:
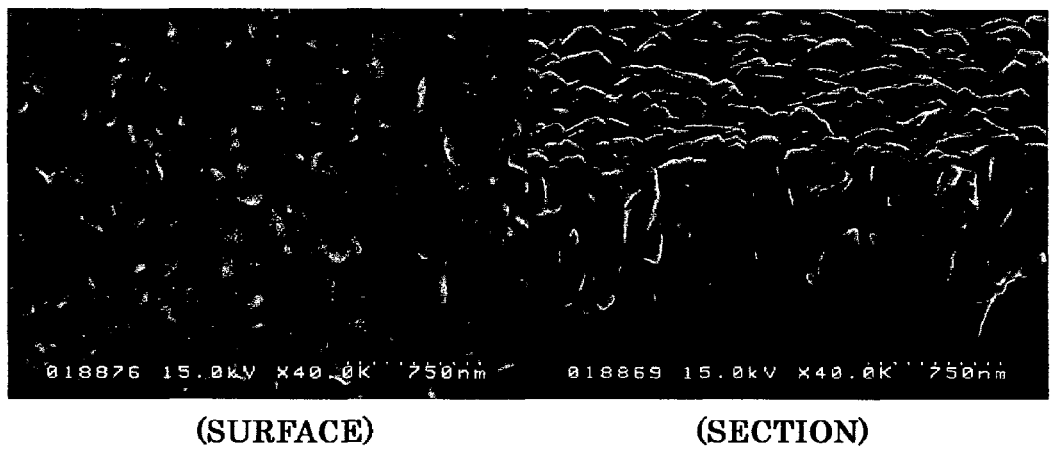
FIGS. 14A–14B shows SEM image photographs of a stacked film composed of glass/ZnO buffer layer/ZnO semiconductor layer.
Figure 14B:
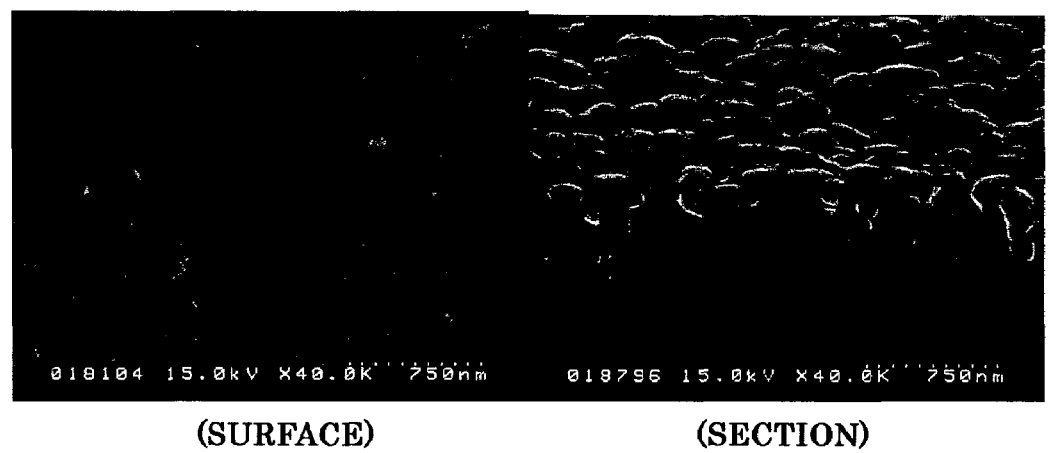

FIGS. 13, 14A and 14B, show the results of characterization of the crystallinity and the SEM image photographs of the surface and the cross section for Sample 1 (flow rate ratio of the oxygen gas of 25% and film thickness of 800 nm) and Sample 2 (flow rate ratio of the oxygen gas of 100% and film thickness of 500 nm) fabricated as such. FIG. 13 further shows the results of characterization of the crystallinity of the example for comparison.

Further, electron mobility was measured for Sample 3 (flow rate ratio of the oxygen gas of 25% and film thickness of 500 nm), Sample 4 (flow rate ratio of the oxygen gas of 50% and film thickness of 500 nm), and Sample 5 (flow rate ratio of the oxygen gas of 100% and film thickness of 500 nm) according to the invention, as well as the example for comparison. The measurement results are shown in Table 4. It should be noted that the ZnO semiconductor layers 3 are of n type, and hence that the electron mobility was measured.

TABLE 4

|  | Comparison | Sample 3 | Sample 4 | Sample 5 |
|---|---|---|---|---|
| Mobility ($cm^2/Vs$) | 5 | 35 | 72 | 80 |

As seen from Table 4, the samples according to the invention had higher electron mobility values than the example for comparison. In particular, in Samples 4 and 5 in which the ZnO buffer layer was formed at a flow rate ratio of the oxygen gas of 50% or higher, a high electron mobility of 72 $cm^2/V \cdot s$ or higher was obtained. Accordingly, a flow rate ratio of the oxygen gas of 50% or higher is preferable in the formation of the ZnO buffer layer.

The reason why a higher electron mobility than that of the example for comparison was obtained in the samples according to the invention is concluded that the ZnO semiconductor layer 3 in the samples according to the invention carried out crystal growth starting from the crystal grains serving as the nuclei of crystal in the ZnO buffer layer 2, and thereby that the grain size in the samples was larger than in the example for comparison.

Figure 15:
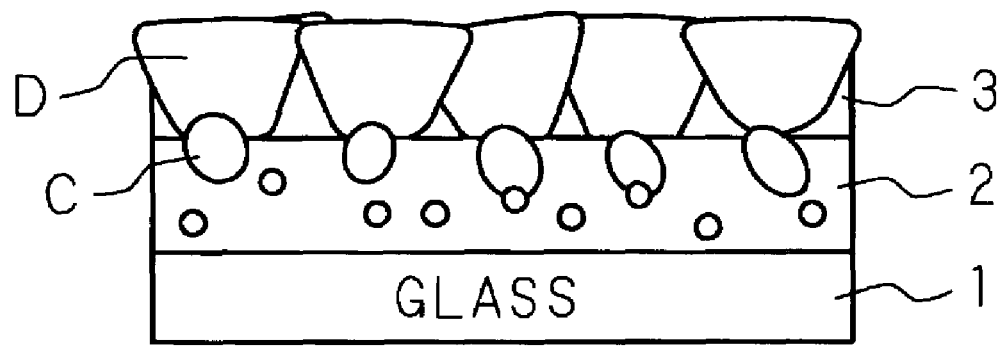
FIG. 15 is a schematic view showing the state of crystal growth according to the invention.
Figure 16:
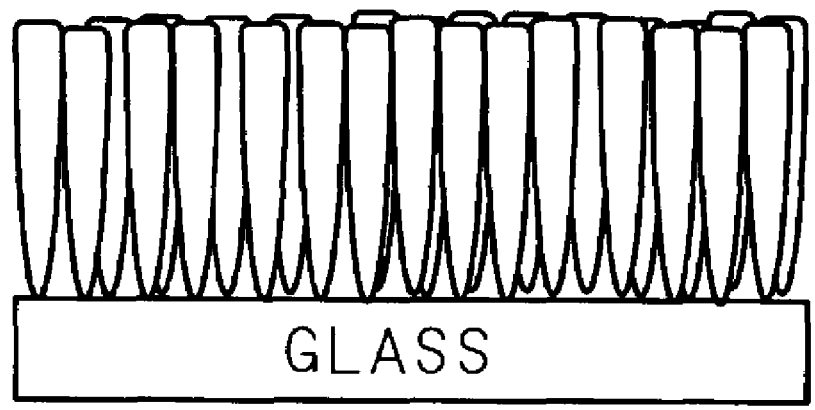
FIG. 16 is a schematic view showing the state of crystal growth according to an example for comparison.

FIG. 15 is a schematic view showing the state of crystal growth according to the invention. FIG. 16 is a schematic view showing the state of crystal growth according to an example for comparison. In the example for comparison, crystal grains have grown in columnar shapes, while the grain size is small. In the invention, large crystal grains D have grown starting from the nuclei composed of large crystal grains C distributed somewhat apart from each other in the ZnO buffer layer 2, whereby the ZnO semiconductor layer 3 has been formed.

Further, as shown in FIG. 12, in a ZnO buffer layer 2 formed at a high flow rate ratio of the oxygen gas, good crystallinity is obtained, and the grain size is large in the ZnO buffer layer 2, and further crystal grains are distributed sufficiently apart from each other. Alternatively, when the formation is carried out at a flow rate ratio of the oxygen gas of 20% or higher, obtained is a ZnO buffer layer 2 having an electric conductivity of $1 \times 10^{-9}$ S/cm or lower. Further, when the formation is carried out at a flow rate ratio of the oxygen gas of 25% or higher, obtained is a ZnO buffer layer 2 having a peak other than (002) and (004). In such ZnO buffer layers 2, the grain size is large, and crystal grains are distributed sufficiently apart from each other. Thus, when a ZnO semiconductor layer 3 is formed on such a ZnO buffer layer 2, reduced is the mutual blockage of the crystal growth due to the mutual collision of adjacent crystal grains during the crystal growth. This permits large crystal grains to grow, and hence results in a high electron mobility.

Further, the buffer layer is composed of non-doped ZnO containing no undesired impurities. This avoids the formation of a ZnO film containing undesired impurities, on the wall and the like of the process chamber. This avoids the mixing, into the ZnO semiconductor layer 3, of the impurities from the ZnO film deposited on the wall and the like or the ZnO buffer layer 2, and thereby provides a ZnO semiconductor layer 3 of high quality.

Furthermore, since the buffer layer is composed of non-doped ZnO as described above, the ZnO buffer layer 2 and the ZnO semiconductor layer 3 can be formed in the same sputtering process chamber. This avoids the necessity of providing separately a process chamber for buffer layer formation and a process chamber for semiconductor layer formation. This reduces the apparatus cost and, hence, the fabrication cost. Further, the ZnO buffer layer 2 and the ZnO semiconductor layer 3 are formed successively without changing the substrate temperature. This reduces the fabrication time and, hence, the fabrication cost.

EXAMPLE 2

In Example 2, a ZnO buffer layer 2 and a ZnO semiconductor layer 3 were formed on a glass substrate 1 by sputtering under the condition shown in Table 5. The mobility and the carrier density of the obtained stacked film were measured by Hall effect measurement.

TABLE 5

| | Substrate Temperature (° C.) | RF Power (W) | Pressure (Pa) | Ar Flow Rate (sccm) | $O_2$ Flow Rate (sccm) | Thickness (nm) |
|---|---|---|---|---|---|---|
| Buffer Layer | 300 | 100 | 0.6 | 0 | 15 | 100~2000 |
| Semiconductor Layer | 300 | 100 | 0.6 | 15 | 0 | 200 |

Figure 17:
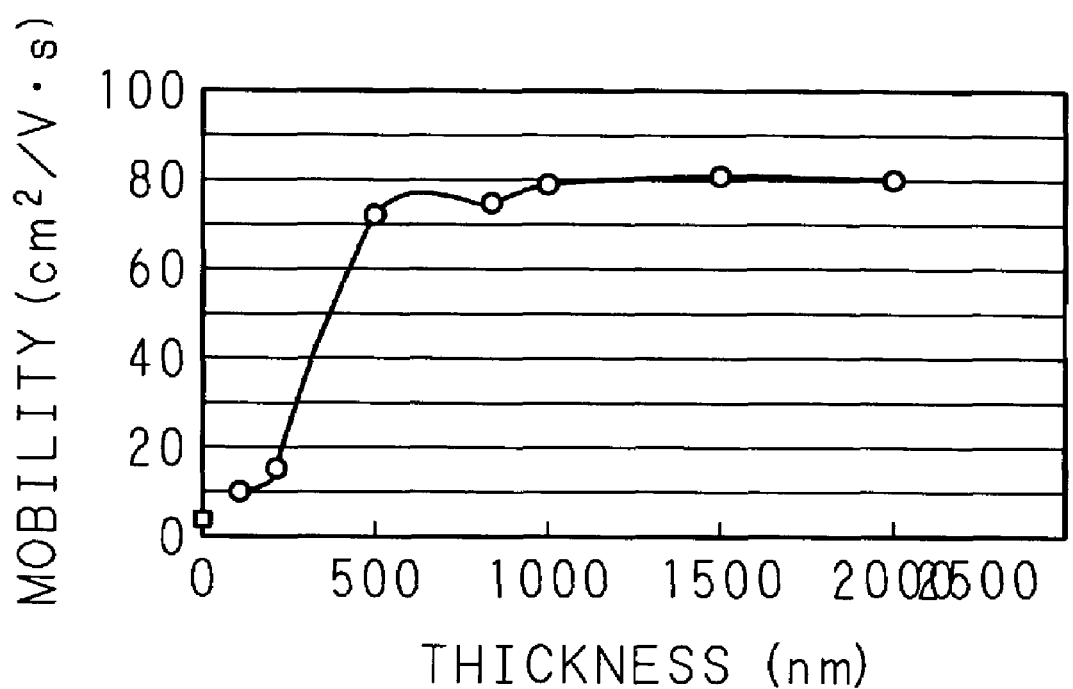
FIG. 17 is a characteristics diagram showing the relation between the mobility of a stacked film composed of glass/ZnO buffer layer/ZnO semiconductor layer and the film thickness of the ZnO buffer layer.
Figure 18:
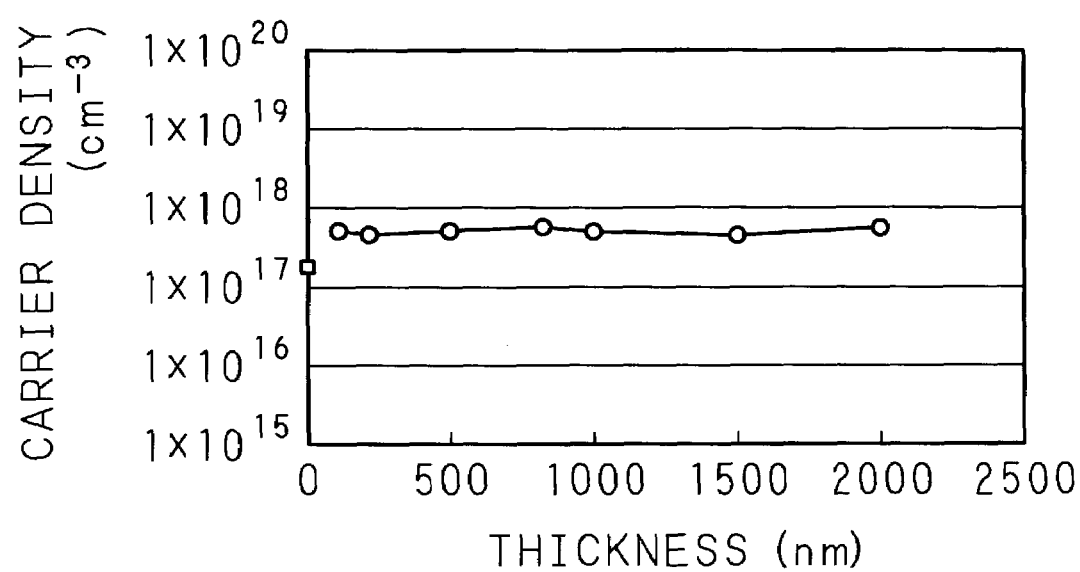
FIG. 18 is a characteristics diagram showing the relation between the carrier density in a stacked film composed of glass/ZnO buffer layer/ZnO semiconductor layer and the film thickness of the ZnO buffer layer.

The difference of Example 2 from Example 1 was that the flow rate ratio of the oxygen gas in the sputtering gas was maintained constant at 100% during the formation of the ZnO buffer layer 2 and that the film thickness of the ZnO buffer layer 2 was changed in a range from 100 nm to 2000 nm. FIG. 17 shows the relation between the mobility of the stacked film composed of ZnO buffer layer 2/ZnO semiconductor layer 3 and the film thickness of the ZnO buffer layer 2. FIG. 18 shows the relation between the carrier density in the stacked film and the film thickness of the ZnO buffer layer 2. Also in the present example, the ZnO semiconductor layer 3 is of n type, and hence the electron mobility was measured for the mobility.

As shown in FIG. 17, in case that the film thickness of the ZnO buffer layer 2 is 500 nm or more, obtained is an improved electron mobility of 70 $cm^2/V \cdot s$ or higher in the stacked film. Further, in case that the film thickness of the ZnO buffer layer 2 is 1000 nm or more, obtained is an improved electron mobility of 80 $cm^2/V \cdot s$ or higher in the stacked film.

As shown in FIG. 18, the carrier density in the stacked film does not depend on the film thickness of the ZnO buffer layer 2, and is substantially constant at approximately $5 \times 10^{17}$ $cm^{-3}$.

From these results, the film thickness of the ZnO buffer layer 2 is preferably 500 nm or more and, more preferably, 1000 nm or more. The reason for this is expectedly concluded that the film thickness of the ZnO buffer layer 2 preferably of 500 nm or more and, more preferably, of 1000 nm or more causes the size of the crystal grains in the ZnO buffer layer 2 to be sufficiently large, and thereby causes the size of the crystal grains in the ZnO semiconductor layer 3 growing from the crystal grains serving as the nuclei of crystal in the ZnO buffer layer 2 to be large.

In case that the film thickness of the ZnO buffer layer 2 exceeds 5000 nm, ridges and depressions appear in the surface of the ZnO buffer layer 2, whereby the flatness is lost. When a ZnO semiconductor layer 3 is formed on the ZnO buffer layer 2 having such a surface shape, similar ridges and depressions appear also in the surface of the ZnO semiconductor layer 3. This degrades the device characteristics when a semiconductor device is formed. Thus, in order that such degradation is avoided in the device characteristics, the film thickness of the ZnO buffer layer 2 is set preferably to be 5000 nm or thinner.

(Embodiment 2)

Described below is a method for fabricating a semiconductor device according to an embodiment of the invention.

Figure 19:
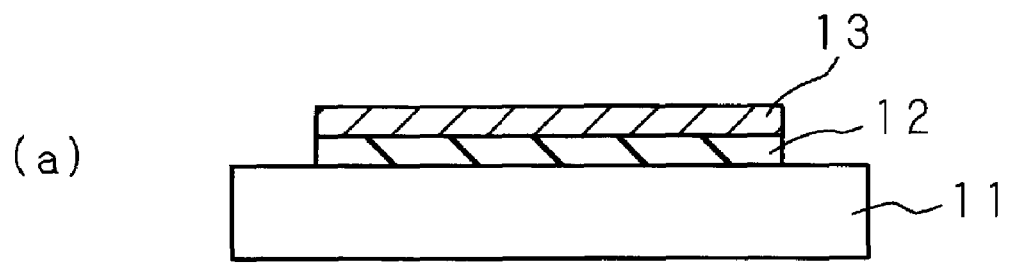
FIGS. 19(a)–(d) shows a process diagram showing a method for fabricating a semiconductor device (FET) according to the invention.
Figure 19:
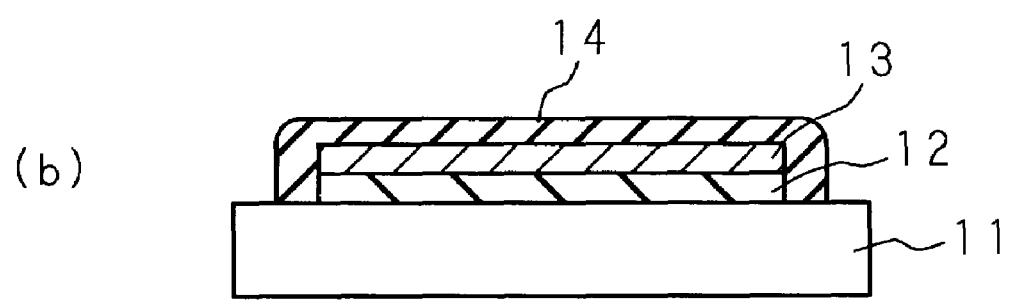
Figure 19:
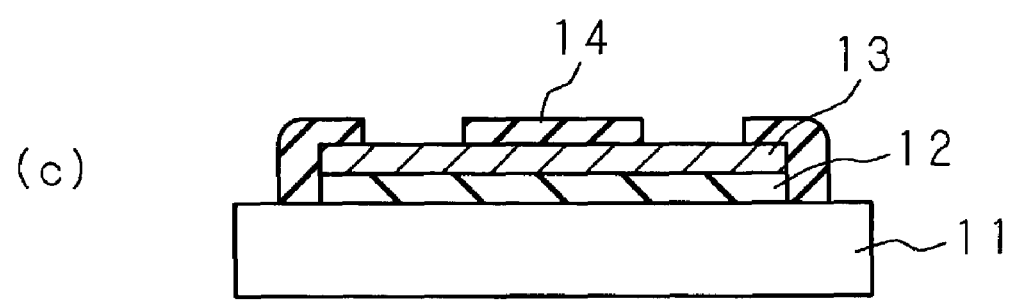
Figure 19:
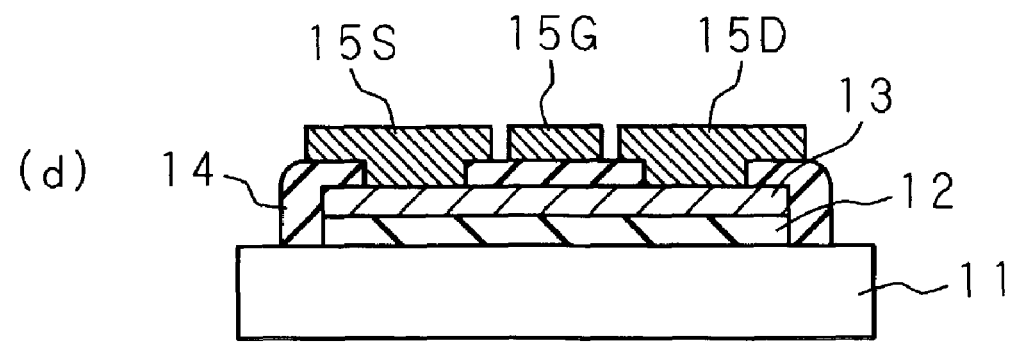

FIG. 19 is a process diagram showing a method for fabricating a semiconductor device according to Embodiment 2. The present embodiment is described for the case that a TFT is fabricated as the semiconductor device.

On a glass substrate 11 cleaned in advance, a ZnO buffer layer 12 having a film thickness of 500 nm or more is formed by sputtering at a flow rate ratio of the oxygen gas of 20% or higher. Then, a ZnO semiconductor layer 13 having a film thickness of approximately 200 nm is formed successively using Ar gas solely as the sputtering gas. At this time, the ZnO buffer layer 12 and the ZnO semiconductor layer 13 are formed at the same substrate temperature successively. At that time, the ZnO buffer layer 12 and the ZnO semiconductor layer 13 may be formed successively by changing the sputtering gas without stopping the electric discharge. Alternatively, after the formation of the ZnO buffer layer 12, the electric discharge may be stopped temporarily, then the sputtering gas may be changed, and then the ZnO semiconductor layer 13 may be formed. Further, the ZnO buffer layer 12 and the ZnO semiconductor layer 13 are formed in the same sputtering process chamber. After that, the stacked film composed of the ZnO buffer layer 12 and the ZnO semiconductor layer 13 is patterned into the shape of an island by lithography or the like (FIG. 19(a)).

Then, a SiN film 14 having a thickness of approximately 500 nm serving as a gate insulating film is formed by RF plasma CVD (FIG. 19(b)). Then, the portions of the SiN film 14 corresponding to the source region and the drain region of the ZnO semiconductor 13 are removed by etching (FIG. 19(c)). Finally, a source electrode 15S, a drain electrode 15D, and a gate electrode 15G composed of Al are formed by vacuum deposition, whereby a TFT is completed according to the present embodiment (FIG. 19(d)).

As described above, the method for fabricating a semiconductor device according to the present embodiment comprises the steps of forming a ZnO buffer layer 12 on a substrate 11 at a high flow rate ratio of the oxygen gas in the sputtering gas; and then forming a ZnO semiconductor layer 13 on the ZnO buffer layer 12 under the condition that the flow rate ratio of the oxygen gas is lower than that in the formation of the ZnO buffer layer 12.

As described above, when the ZnO buffer layer 12 is formed at a flow rate ratio of the oxygen gas of 20% or higher, large crystal grains are formed in the ZnO buffer layer 12. Further, adjacent crystal grains are distributed not close to but somewhat apart from each other. As such, the flow rate ratio of the oxygen gas is set at 20% or higher, formed is a ZnO buffer layer 12 having an electric conductivity of $1 \times 10^{-9}$ S/cm or lower or alternatively a ZnO buffer layer 12 having a peak other than (002) and (004). Accordingly, large crystal grains are formed in the ZnO buffer layer 12. Further, adjacent crystal grains are distributed not close to but somewhat apart from each other.

Then, the ZnO semiconductor layer 13 carries out crystal growth starting from the crystal grains serving as the nuclei of crystal in the ZnO buffer layer 12, while these crystal grains are distributed somewhat apart from each other in the ZnO buffer layer 12. This reduces the mutual blockage of the crystal growth due to the mutual collision of adjacent crystal grains during the crystal growth. As a result, the ZnO semiconductor layer 13 grows in a large grain size. Furthermore, the ZnO buffer layer 12 is formed from the same material as that of the ZnO semiconductor layer 13. Thus, the junction between the ZnO buffer layer 12 and the ZnO semiconductor layer 13 constitutes a homojunction which results in good lattice matching. Thus, the ZnO semiconductor layer 13 grows in an improved grain size. This permits the fabrication of a semiconductor device (TFT) comprising a ZnO semiconductor layer 13 having good crystallinity and an improved mobility.

Further, the ZnO buffer layer 12 is composed of non-doped ZnO containing no undesired impurities. This avoids the formation of a ZnO film containing undesired impurities, on the wall and the like of the process chamber. This avoids the mixing, into the ZnO semiconductor layer 13, of the impurities from the ZnO film deposited on the wall and the like or the ZnO buffer layer 12, and thereby provides a ZnO semiconductor layer 13 of high quality.

Furthermore, since the ZnO buffer layer 12 is composed of non-doped ZnO as described above, the ZnO buffer layer 12 and the ZnO semiconductor layer 13 can be formed in the same sputtering process chamber. This avoids the necessity of providing separately a process chamber for buffer layer formation and a process chamber for semiconductor layer formation. This reduces the apparatus cost and, hence, the fabrication cost.

Further, the ZnO buffer layer 12 and the ZnO semiconductor layer 13 are formed successively without changing the substrate temperature. This reduces the fabrication time and, hence, the fabrication cost.

As such, the present embodiment permits the fabrication of a TFT comprising a channel composed of a ZnO semiconductor layer 13 having good crystallinity and a high mobility, and thereby provides a TFT having good characteristics.

EXAMPLE 3

In an example of the present embodiment, a ZnO buffer layer 12 and a ZnO semiconductor layer 13 were formed under the condition shown in Table 6, whereby a TFT was fabricated. Also in the present example, an RF magnetron sputtering apparatus was used, whereby the ZnO buffer layer 12 and the ZnO semiconductor layer 13 were formed in the same process chamber at the same substrate temperature (300° C.). The sputtering gas used was a mixture gas between Ar gas and $O_2$ gas. In the formation of the ZnO buffer layer 12, the flow rate ratio of the oxygen gas was 100%, while in the formation of the ZnO semiconductor layer 13, the flow rate ratio of the oxygen gas was 0%. As an example for comparison, a TFT was fabricated without a ZnO buffer layer 12 with the other condition having been the same as the present example.

TABLE 6

| | Substrate Temperature (° C.) | RF Power (W) | Pressure (Pa) | Ar Flow Rate (sccm) | $O_2$ Flow Rate (sccm) | Thickness (nm) |
|---|---|---|---|---|---|---|
| Buffer Layer | 300 | 100 | 0.6 | 0 | 15 | 1000 |
| Semi-conductor Layer | 300 | 100 | 0.6 | 16 | 0 | 200 |

As a result, the TFT according to the present example had a filed effect mobility of approximately 2 $cm^2/V \cdot s$, while the TFT according to the example for comparison had a filed effect mobility as low as approximately 0.2 $cm^2/V \cdot s$. This is expectedly because that the ZnO semiconductor layer according to the present example has better crystallinity than the ZnO semiconductor layer according to the example for comparison.

(Embodiment 3)

Described below is another method for fabricating a semiconductor device according to an embodiment of the invention.

Figure 20:
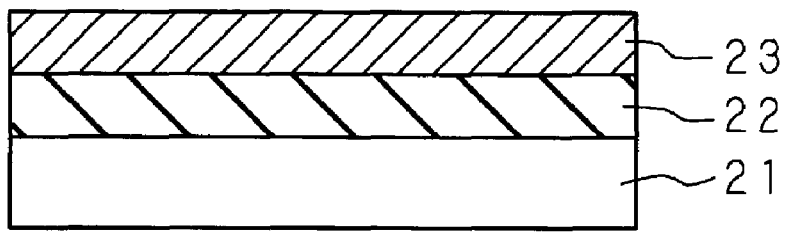
FIGS. 20(a)–(d) shows a process diagram showing a method for fabricating a semiconductor device (light emitting diode) according to the invention.
Figure 20:
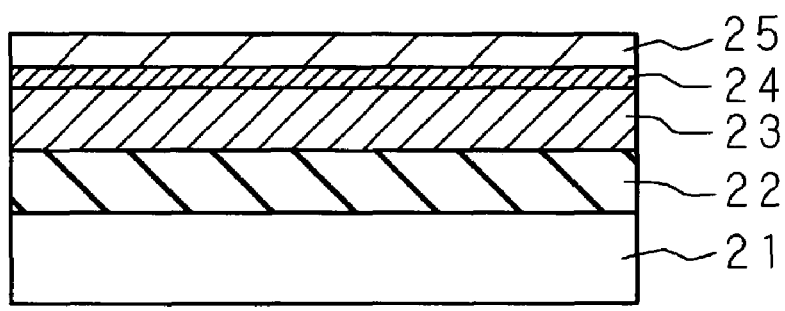
Figure 20:
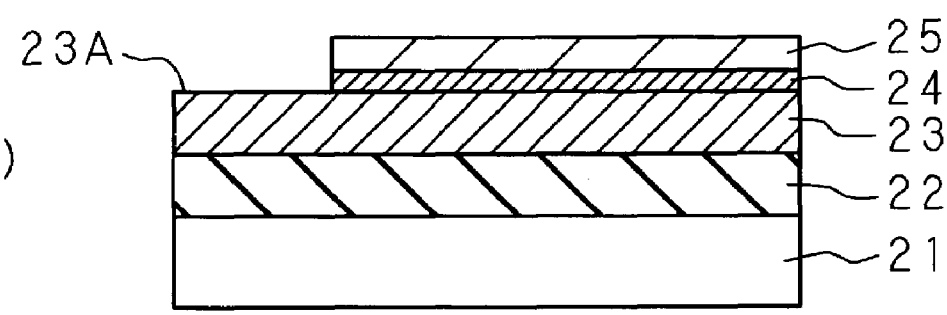
Figure 20:
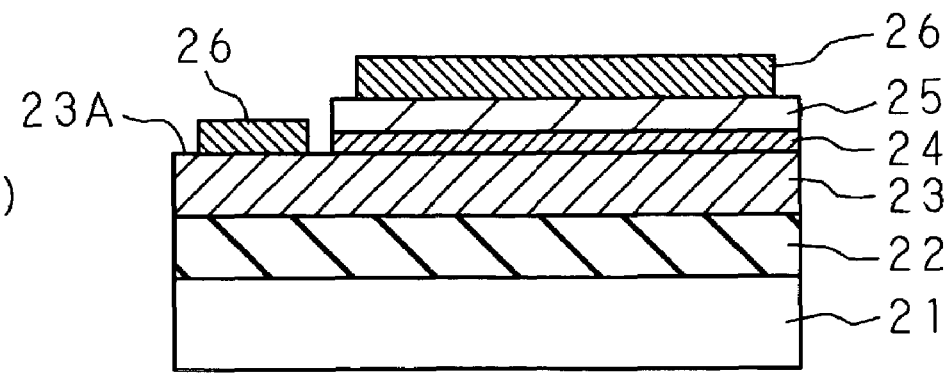

FIG. 20 is a process diagram showing a method for fabricating a semiconductor device according to the present embodiment. The present embodiment is described for the case that a light emitting diode is fabricated as the semiconductor device.

On a sapphire substrate 21 cleaned in advance, a ZnO buffer layer 22 having a film thickness of 1 μm is formed by sputtering at a flow rate ratio of the oxygen gas of 20% or higher. Then, a ZnO semiconductor layer 23 having a film thickness of 1 μm is formed successively using Ar gas solely as the sputtering gas (FIG. 20(*a*)). Here, the ZnO semiconductor layer 23 is of n type as described above.

The ZnO buffer layer 22 and the ZnO semiconductor layer 23 are formed in the same sputtering process chamber. At that time, the ZnO buffer layer 22 and the ZnO semiconductor layer 23 may be formed successively at a constant substrate temperature by changing solely the sputtering gas without stopping the electric discharge. Alternatively, after the formation of the ZnO buffer layer 22, the electric discharge may be stopped temporarily, then the sputtering gas may be changed, and then the ZnO semiconductor layer 23 may be formed.

Then, a ZnO active layer 24 having a thickness of approximately 0.2 μm is formed on the n-type ZnO semiconductor layer 23. The formation of the ZnO active layer 24 is carried out by MBE, whereby the ZnO active layer 24 doped with Ga is formed. The amount of the doped Ga in the ZnO active layer 24 is preferably in a range from $1 \times 10^{17}$ $cm^{-3}$ to $1 \times 10^{15}$ $cm^{-3}$. Another group-13 element such as Al may be doped in place of Ga. Then, a p-type ZnO layer 25 doped with N is formed on the ZnO active layer 24 by MBE (FIG. 20(*b*)).

After that, a part of the p-type ZnO layer 25 and the ZnO active layer 24 is removed by etching, whereby a part of the n-type ZnO layer 23 is exposed. This forms an n-electrode formation region 23A (FIG. 20(*c*)). Finally, electrodes 26 composed of Al are formed on the n-electrode formation region 23A of the n-type ZnO layer 23 and on the p-type ZnO layer 25 by vacuum deposition, whereby a light emitting diode is completed (FIG. 20(*d*)).

The present embodiment also comprises the steps of: forming a ZnO buffer layer 22 on a substrate 21 at a high flow rate ratio of the oxygen gas in the sputtering gas; and then forming a ZnO semiconductor layer 23 on the ZnO buffer layer 22 under the condition that the flow rate ratio of the oxygen gas is lower than that in the formation of the ZnO buffer layer 22.

As described above, when the ZnO buffer layer 22 is formed at a flow rate ratio of the oxygen gas of 20% or higher, large crystal grains are formed in the ZnO buffer layer 22. Further, adjacent crystal grains are distributed not close to but somewhat apart from each other. As such, the flow rate ratio of the oxygen gas is set at 20% or higher, formed is a ZnO buffer layer 22 having an electric conductivity of $1 \times 10^{-9}$ S/cm or lower or alternatively a ZnO buffer layer 22 having a peak other than (002) and (004). Accordingly, large crystal grains are formed in the ZnO buffer layer 22. Further, adjacent crystal grains are distributed not close to but somewhat apart from each other.

Then, the ZnO semiconductor layer 23 carries out crystal growth starting from the crystal grains serving as the nuclei of crystal in the ZnO buffer layer 22, while these crystal grains are distributed somewhat apart from each other in the ZnO buffer layer 22. This reduces the mutual blockage of the crystal growth due to the mutual collision of adjacent crystal grains during the crystal growth. As a result, the ZnO semiconductor layer 23 grows in a large grain size. Furthermore, the ZnO buffer layer 22 is formed from the same material as that of the ZnO semiconductor layer 23. Thus, the junction between the ZnO buffer layer 22 and the ZnO semiconductor layer 23 constitutes a homojunction which results in good lattice matching. Thus, the ZnO semiconductor layer 23 grows in an improved grain size. This permits the fabrication of a semiconductor device (light emitting diode) comprising a ZnO semiconductor layer 23 having good crystallinity and an improved mobility.

Further, the ZnO buffer layer 22 is composed of non-doped ZnO containing no undesired impurities. This avoids the formation of a ZnO film containing undesired impurities, on the wall and the like of the process chamber. This avoids the mixing, into the ZnO semiconductor layer 23, of the impurities from the ZnO film deposited on the wall and the like or the ZnO buffer layer 22, and thereby provides a ZnO semiconductor layer 23 of high quality.

As described above, the ZnO active layer 24 and the p-type ZnO semiconductor layer 25 are formed on the n-type ZnO semiconductor layer 23 having a large grain size and having no mixing of undesired impurities. This improves the characteristics of the ZnO active layer 24 and the p-type ZnO semiconductor layer 25. Accordingly, the present embodiment provides a light emitting diode having good device characteristics.

Furthermore, since the ZnO buffer layer 22 is composed of non-doped ZnO as described above, the ZnO buffer layer 22 and the ZnO semiconductor layer 23 can be formed in the same sputtering process chamber. This avoids the necessity of providing separately a process chamber for buffer layer formation and a process chamber for semiconductor layer formation. This reduces the apparatus cost and, hence, the fabrication cost. Further, the ZnO buffer layer 22 and the ZnO semiconductor layer 23 are formed successively without changing the substrate temperature. This reduces the fabrication time and, hence, the fabrication cost.

Described below are Embodiments 4 and 5 which use the fact that the electric conductivity of a formed ZnO film can be changed easily and accurately in a wide range by using a non-doped ZnO target and changing the flow rate ratio of the oxygen gas in the sputtering gas (see FIGS. 2–4). In Embodiments 4 and 5, a ZnO film is formed on a glass substrate by using a known RF sputtering apparatus. Non-doped ZnO (99.99%) is used as a target, while Ar gas and $O_2$ gas are used as sputtering gas. The conditions for ZnO film formation are a substrate temperature of 300° C., a pressure of 0.5 Pa, and an RF power density of 10 W/$Cm^2$.

(Embodiment 4)

Figure 21:
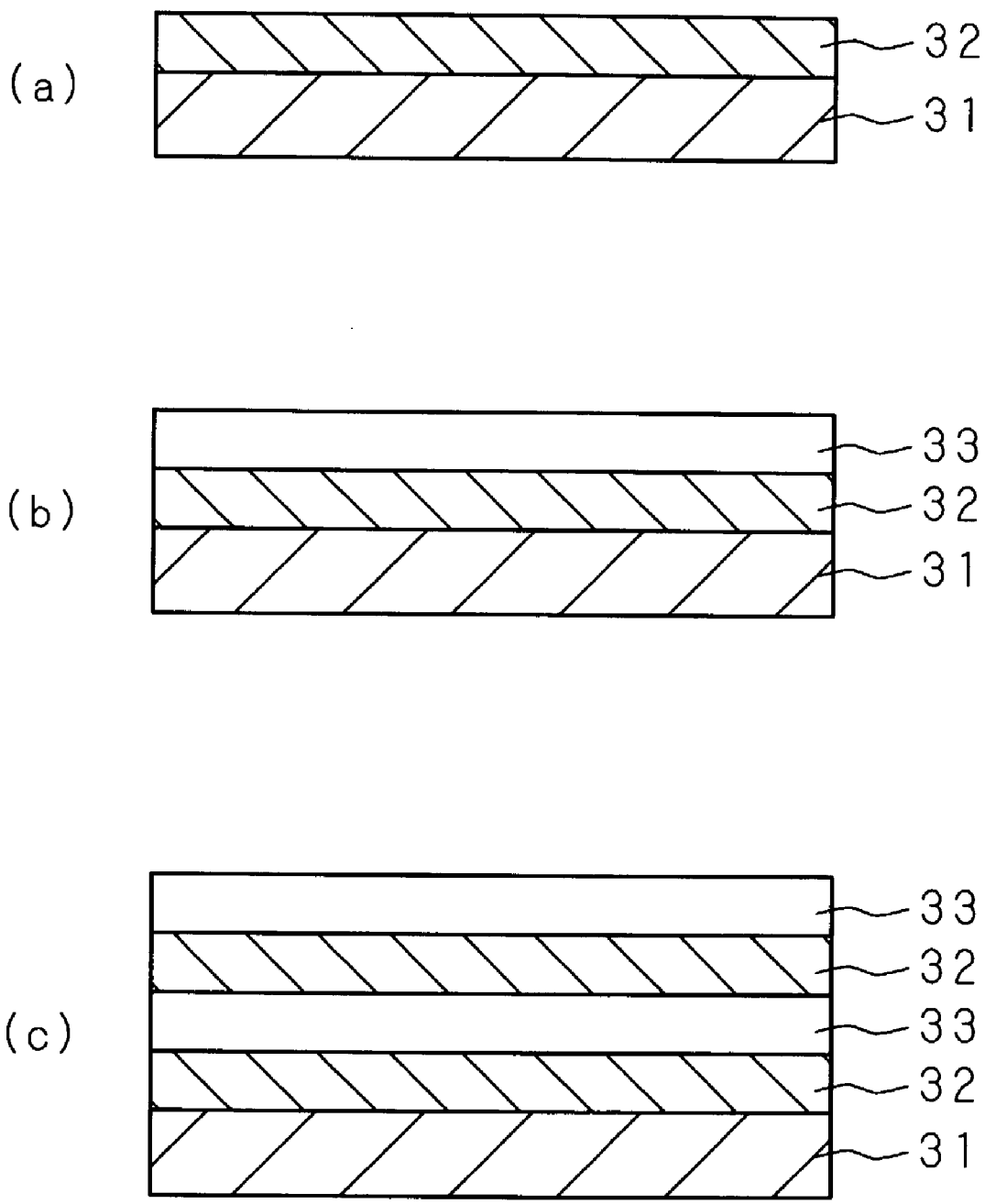
FIGS. 21(a)–(c) shows cross sectional views of a structure illustrating a method for forming a ZnO film according to the invention.

FIG. 21 is a diagram illustrating the processes that a multi-layer film composed of ZnO films having different electric conductivities is formed by a method for forming a ZnO film according to Embodiment 4 of the invention.

A first ZnO film 32 having a film thickness of 100 Å is formed on one side of a glass substrate 31 at a flow rate ratio of the oxygen gas in the sputtering gas of 100% (FIG. 21(a)). Then, the electric discharge is turned off. After the flow rate ratio of the oxygen gas is reduced to 0%, the electric discharge is restarted, whereby a second ZnO film 33 having a film thickness of 100 Å is formed on the first ZnO film 32 (FIG. 21(b)). In a similar manner, a first ZnO film 32 and a second ZnO film 33 are stacked alternately (FIG. 21(c)).

Figure 22:
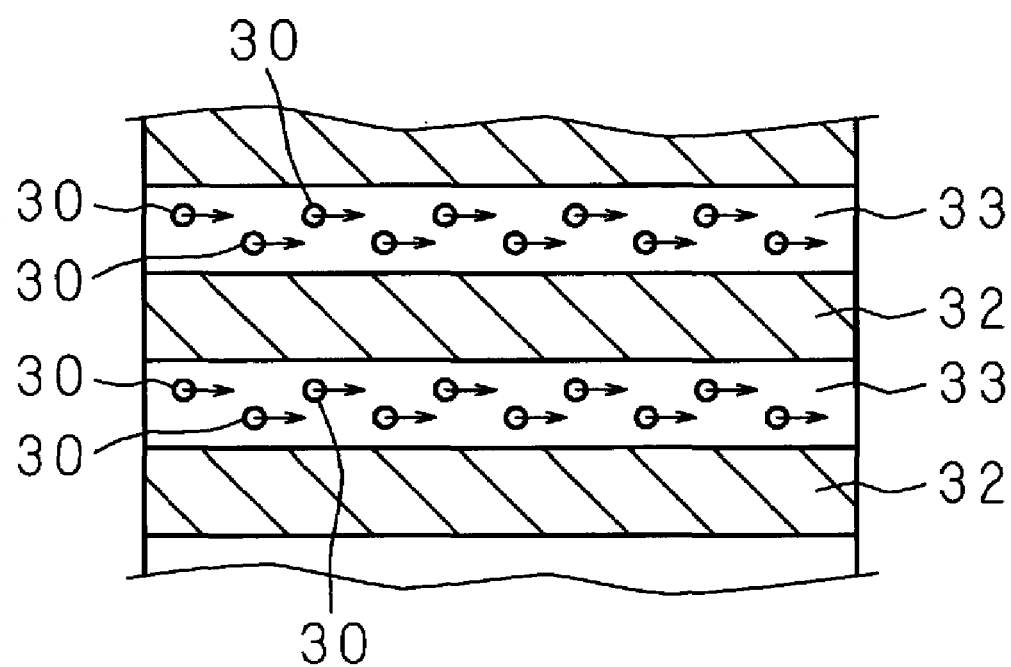
FIG. 22 is a schematic view showing a multi-layer ZnO film according to the invention.

The multi-layer ZnO film formed by the above-mentioned method is composed of stacked layers of first ZnO films 32 having a high resistance and second ZnO films 33 having a low resistance. Accordingly, the second ZnO films 33, 33, . . . are insulated by the first ZnO films 32, 32, . . . . FIG. 22 is a schematic view showing a multi-layer ZnO film formed as described above. In the figure, numeral 30 indicates an electron contributing to the electric conduction. Each electron 30 travels within the second ZnO film 33 where the electron 30 is present, and does not move through a first ZnO film 32 to another second ZnO film 33. That is, the electrons 30, 30, are confined in each second ZnO film 33. This avoids a reduction in the mobility due to impurity scattering. Thus, this multi-layer film has a high electron mobility.

As a result, the present embodiment permits easy and low-cost fabrication of an electronic device (such as a TFT) comprising a multi-layer film of different electric conductivities and thereby having a high electron mobility.

(Embodiment 5)

Figure 23:
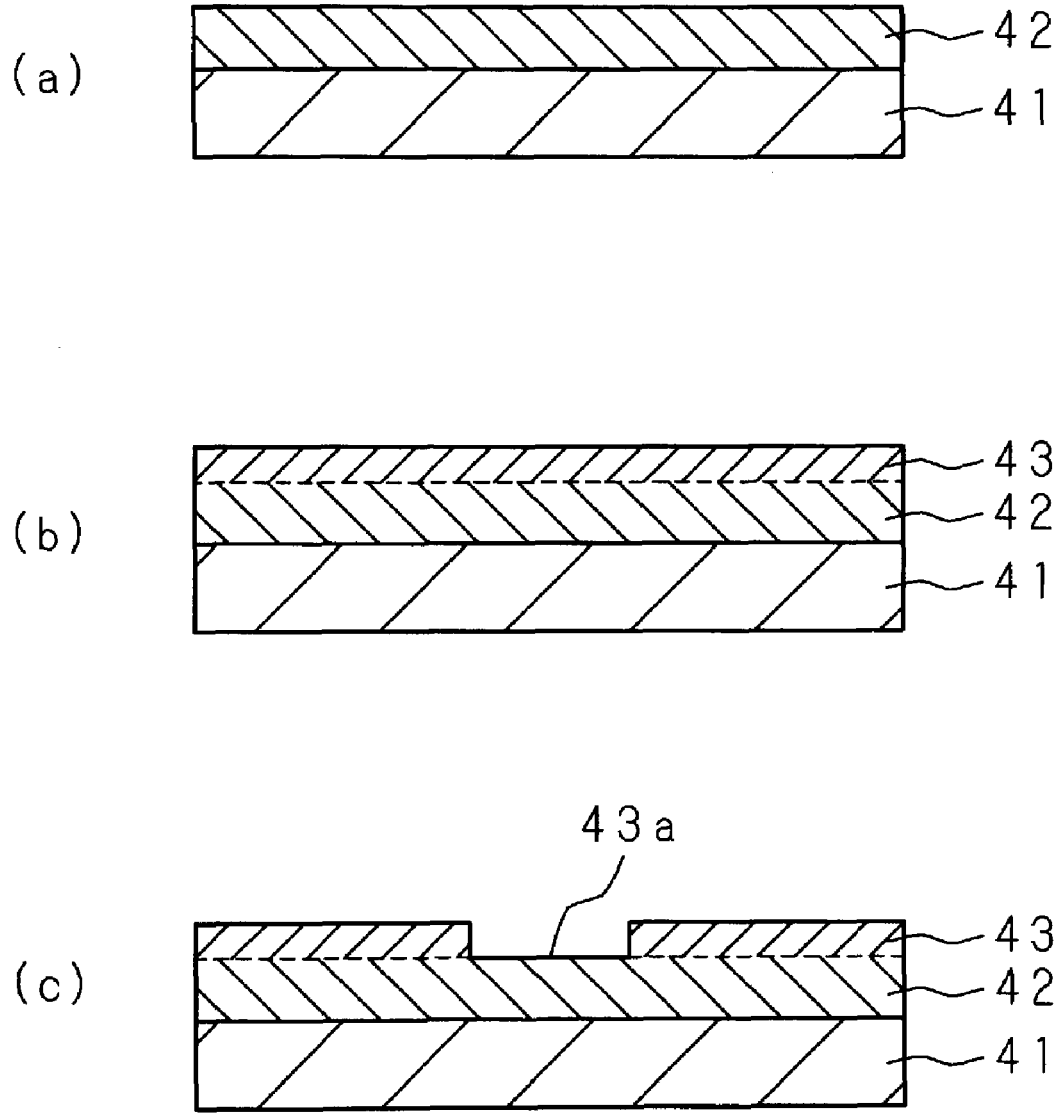
FIGS. 23(a)–(c) shows a process diagram showing a method for fabricating a semiconductor device (FET) according to the invention.
Figure 24:
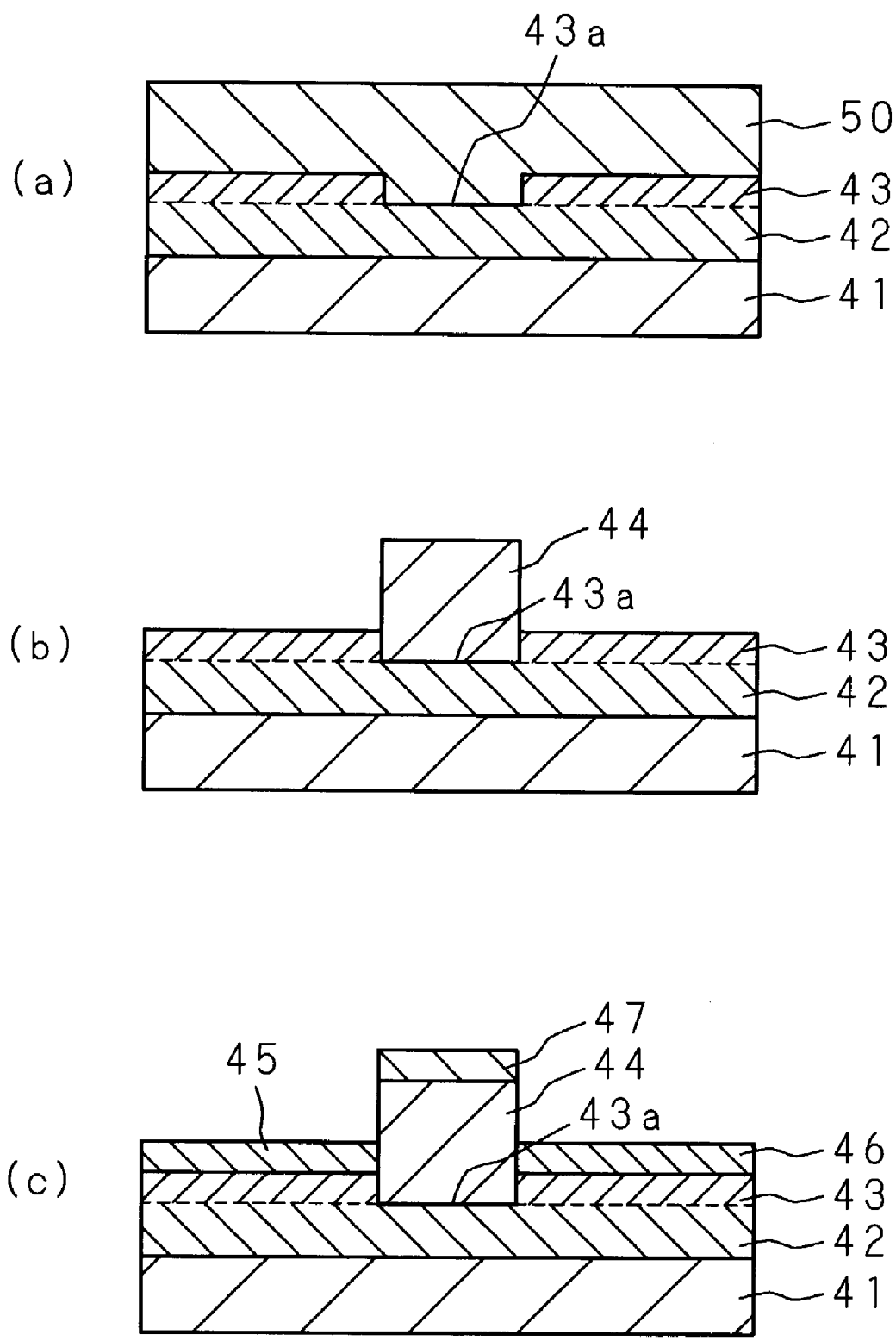
FIGS. 24(a)–(c) shows a process diagram showing a method for fabricating a semiconductor device (FET) according to the invention.

FIGS. 23 and 24 are process diagrams showing a method for fabricating a semiconductor device (an FET comprising a stacked film having LDD/semiconductor film structure) according to Embodiment 5 of the invention.

A ZnO semiconductor film 42 having a film thickness of 200 nm is formed on one side of a glass substrate 41 at a flow rate ratio of the oxygen gas in the sputtering gas of 3% (FIG. 23(a)). Then, without the electric discharge being turned off, the flow rate ratio of the oxygen gas is reduced continuously from 3% to 0%, whereby an LDD/source-drain film 43 having a film thickness of 10 nm is formed on the ZnO semiconductor film 42 (FIG. 23(b)). Then, a part of the LDD/source-drain film 43 is removed by etching with dilute hydrochloric acid, whereby a groove 43a is formed (FIG. 23(c)).

SiN is deposited onto the LDD/source-drain film 43 and the groove 43a by plasma CVD, whereby an insulating film 50 having a film thickness of 500 nm is formed (FIG. 24(a)). Then, the portion of the insulating film 50 covering the LDD/source-drain film 43 is solely removed by etching, whereby an insulating layer 44 having its base on the groove 43a is formed (FIG. 24(b)). Finally, Al films are formed on the LDD/source-drain film 43 and the insulating layer 44, whereby a source electrode 45 and a drain electrode 46 are formed on the LDD/source-drain film 43, while a gate electrode 47 is formed on the insulating layer 44 (FIG. 24(c)).

In the film forming method as described above, a ZnO semiconductor film is formed on the n⁻ type ZnO semiconductor film 42 with the flow rate ratio of the oxygen gas being reduced continuously from 3% to 0%, the LDD/source-drain film 43 varying continuously from n⁻ type to n⁺ type is easily stacked.

Further, since the film is formed with the flow rate ratio of the oxygen gas being reduced continuously, the LDD/source-drain film 43 has an electric conductivity increasing continuously in the film thickness direction starting from the substrate side. Thus, the regions on the source electrode 45 side and the drain electrode 46 side of the LDD/source-drain film 43 have a high electric conductivity and serve as a source region and a drain region. Further, the region on the ZnO semiconductor film 42 side of the LDD/source-drain film 43 has a lower electric conductivity than the source region and the drain region, and serves as an LDD region. As a result, an FET comprising a stacked film having LDD/semiconductor film structure is fabricated easily at a low cost.

In the FET formed as described above, the electric field in the vicinity of the drain electrode is alleviated by the LDD/semiconductor film structure. This avoids the performance degradation of the FET due to hot electrons (carriers accelerated to a high speed are injected to the insulating layer 44 and thereby serve as fixed charges).

In the above-mentioned embodiments, an RF sputtering apparatus has been used, while $O_2$ gas and Ar gas have been used as the sputtering gas. However, a DC sputtering apparatus, an ECR sputtering apparatus, or a helicon plasma wave sputtering apparatus may be used, while $O_2$ gas and an inert gas, such as He gas, Ne gas, and Kr gas, may be used as the sputtering gas.

Further, the description has been made for the case that the semiconductor device is a TFT and a light emitting diode. However, the semiconductor device according to the invention is not limited to these, and the invention is applicable to other semiconductor devices such as an optical sensor.

As described above, a method for forming a ZnO semiconductor layer according to the invention permits the formation of a ZnO semiconductor layer having a large grain size and an improved mobility, and further reduces the fabrication cost.

A method for fabricating a semiconductor device according to the invention permits the fabrication of a semiconductor device comprising a ZnO semiconductor layer having a large grain size and an improved mobility, and thereby improves the device characteristics. Further, the method reduces the fabrication cost.

A semiconductor device according to the invention comprises a ZnO semiconductor layer having a large grain size and an improved mobility, and thereby provides a semiconductor device with improved device characteristics.

A method for forming a ZnO film according to the invention permits the formation of a plurality of ZnO films having different electric conductivities at a reduced material cost. Further, the method permits the formation of a ZnO film having an electric conductivity varying continuously in the film thickness direction. Furthermore the method permits the alternate stacking of ZnO films having a low electric conductivity and ZnO films having a high electric conductivity.

A method for fabricating a semiconductor device according to the invention permits easy and low-material-cost fabrication of a semiconductor device comprising a ZnO film having an electric conductivity varying continuously in the film thickness direction.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A method for fabricating a semiconductor device, comprising the steps of:
  using a non-doped ZnO target and forming a first ZnO film on a substrate by sputtering with a sputtering gas containing oxygen and also forming a second ZnO film on the first ZnO film by sputtering with the flow rate ratio of the oxygen gas in the sputtering gas being decreased continuously;
  forming a groove dividing the second ZnO film;
  providing a gate electrode over the groove via an insulating layer; and
  providing, on the second ZnO film, a source electrode and a drain electrode facing each other with the groove therebetween.

2. The method for fabricating a semiconductor device according to claim 1 in which the step for forming a said first ZnO film by sputtering, further comprises:
  oxygen gas, or a mixture of an inert gas and an oxygen gas as a said sputtering gas; and
  changing the flow rate ratio of the oxygen gas in the sputtering gas during the film formation.

3. The method for forming a said first ZnO film according to claim 2, wherein the flow rate ratio of the oxygen gas is changed continuously.

4. The method for forming said first ZnO film according to claim 2, wherein the flow rate ratio of the oxygen gas is increased and decreased alternately.

* * * * *